United States Patent [19]

Tsuchi et al.

[11] Patent Number: 5,814,981

[45] Date of Patent: Sep. 29, 1998

[54] VOLTAGE CIRCUIT FOR GENERATING MULTIPLE STABLE VOLTAGES

[75] Inventors: Hiroshi Tsuchi; Hiroshi Hayama, both of Tokyo, Japan

[73] Assignee: NEC Corporation, Tokyo, Japan

[21] Appl. No.: 802,548

[22] Filed: Feb. 18, 1997

[30] Foreign Application Priority Data

Feb. 15, 1996 [JP] Japan ................................. 8-027623

[51] Int. Cl.⁶ .................................................. H03H 7/00
[52] U.S. Cl. ......................... 323/369; 323/298; 323/354
[58] Field of Search .................................. 323/298, 353, 323/354, 369

[56] References Cited

U.S. PATENT DOCUMENTS

| | | | |
|---|---|---|---|
| 5,339,021 | 8/1994 | Thomson | 323/354 |
| 5,363,070 | 11/1994 | Arimoto | 323/353 |
| 5,389,872 | 2/1995 | Erhart et al. | 323/369 |

FOREIGN PATENT DOCUMENTS

| | | | |
|---|---|---|---|
| 64-39757 | 2/1989 | Japan | H01L 27/04 |
| 3-264922 | 11/1991 | Japan | G05F 1/133 |
| 3-274089 | 12/1991 | Japan | G09G 3/36 |
| 3-274090 | 12/1991 | Japan | G09G 3/36 |
| 7-153914 | 6/1995 | Japan | H01L 27/04 |
| 8-160916 | 6/1996 | Japan | G09G 3/36 |

*Primary Examiner*—Jeffrey L. Sterrett
*Attorney, Agent, or Firm*—Sughrue, Mion, Zinn, Macpeak & Seas, PLLC

[57] ABSTRACT

In a multi-valued voltage generating circuit including a voltage divider connected between first and second nodes and formed by a series of resistors, and an output circuit, connected to the first and second nodes and nodes of the resistors, for selecting one of voltages at the first and second nodes and the nodes of said resistors and generating the one of voltages at an output terminal, first and second control voltage circuits are connected to the first and second nodes to control an output voltage at the output terminal to compensate for fluctuations of the threshold voltages of MOS transistors of the output circuit. Also, first and second current control circuits are connected to the first and second nodes, to control currents flowing through the series of resistors to control a difference in potential between the first and second nodes at a certain value and to compensate for the fluctuation of the resistance.

23 Claims, 26 Drawing Sheets

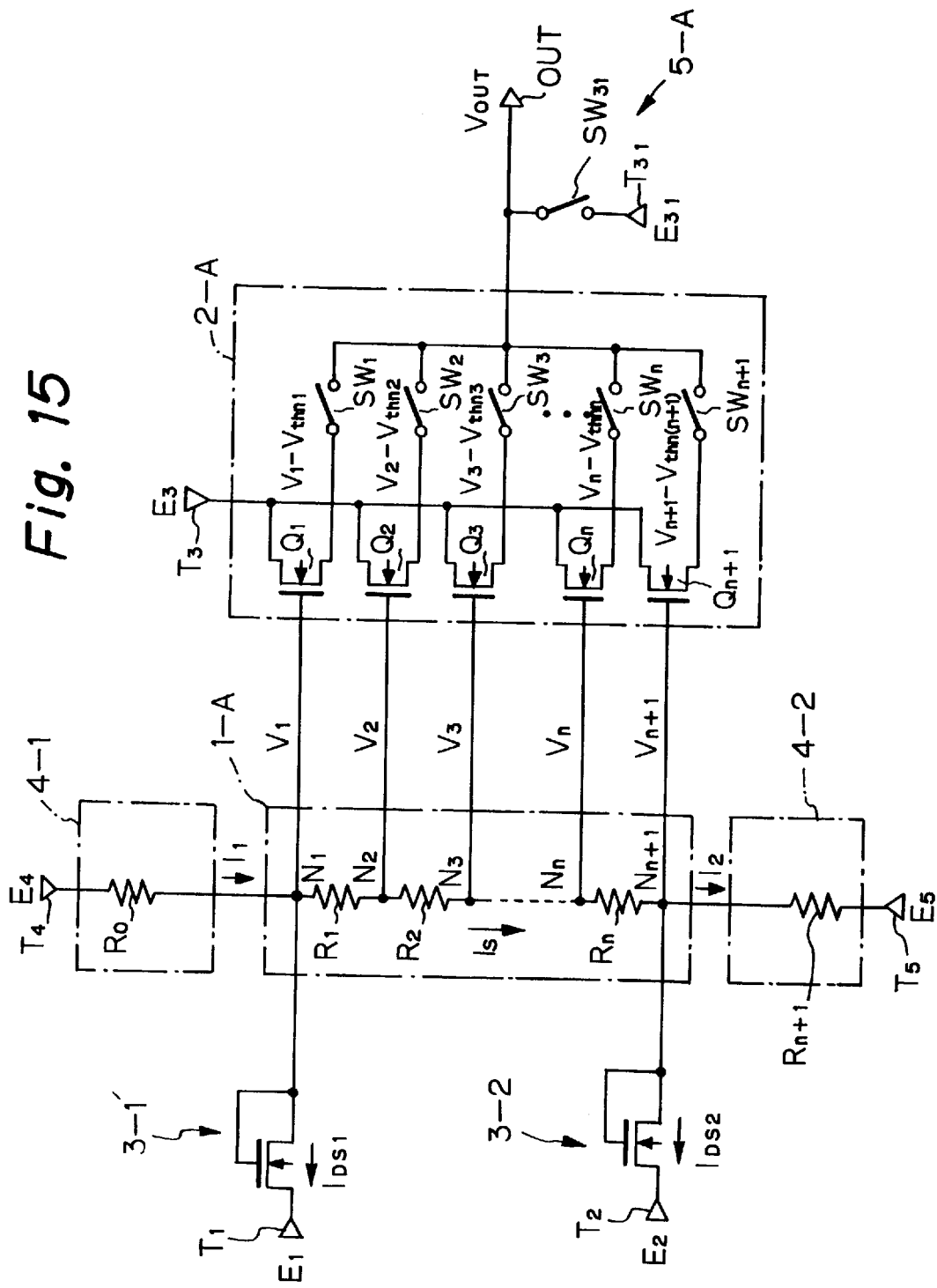

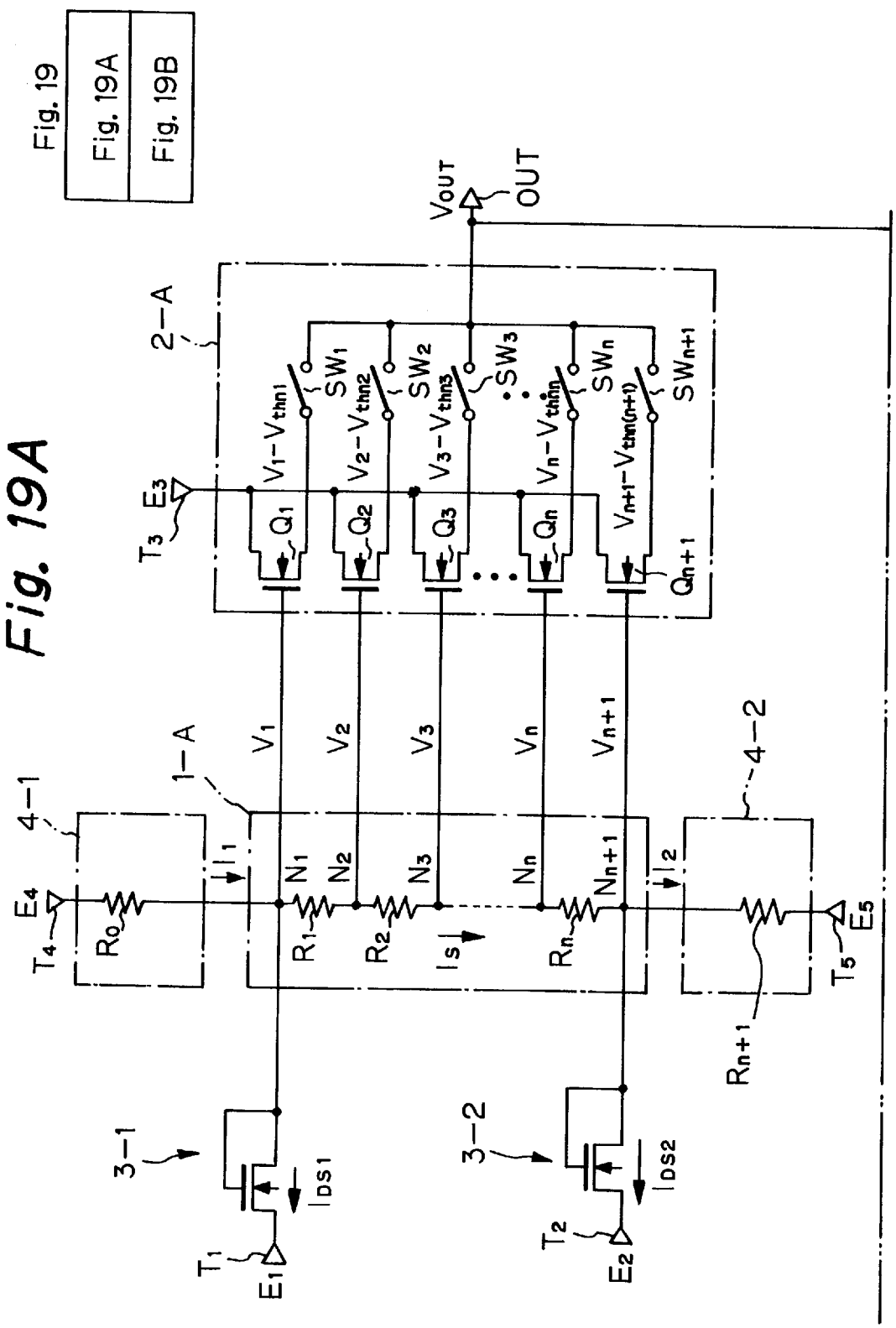

VOLTAGE CIRCUIT FOR GENERATING MULTIPLE STABLE VOLTAGES

BACKGROUND OF THE INVENTION

1. Field of the Invention

The present invention relates to a multi-valued voltage generating circuit.

2. Description of the Related Art

Multi-valued voltage circuits have been used in various electric apparatuses such as a circuit for driving a liquid crystal display (LCD) apparatus.

In a first prior art multi-valued voltage generating circuit (see: JP-A-3-264922), a voltage divider formed by resistors connected in series is connected between power supply terminals. Nodes of the resistors are connected via an output circuit formed by switches to an output terminal. In this case, one of the switches is turned ON. Therefore, an output voltage at the output terminal has multi-values in accordance with the switches. This will be explained later in detail.

In the first prior art multi-valued voltage generating circuit, however, even when this circuit is formed by a single integrated circuit device, an output impedance is not constant.

In a second prior art multi-valued voltage generating circuit (see: JP-A-3-274089 and JP-A-3-274090), in order to make the output impedance constant, an impedance transformation circuit formed by voltage followers (operational amplifiers) is inserted between the voltage divider and the output circuit of the first prior art multi-valued voltage generating circuit. This will also be explained later in detail.

In the second prior art multi-valued voltage generating circuit, however, if this circuit is formed by a single integrated circuit device, the number of operational amplifiers is increased as the number of multi-valued voltages is increased. Therefore, the chip size is increased, which reduces the manufacturing yield. In addition, steady currents are required for the operational amplifiers, which increases the power dissipation.

In a third prior art multi-valued voltage generating circuit (see: JP-A-7-153914), MOS transistors are provided instead of the operational amplifiers of the second prior art multi-valued voltage generating circuit.

In the third prior art multi-valued voltage generating circuit, however, when the threshold voltages of the MOS transistors fluctuate due to the manufacturing process, the output voltage at the output terminal fluctuates.

SUMMARY OF THE INVENTION

It is an object of the present invention to provide a stable multi-valued voltage generating circuit without operational amplifiers.

According to the present invention, in a multi-valued voltage generating circuit including a voltage divider connected between first and second nodes and formed by a series of resistors, and an output circuit, connected to the first and second nodes and nodes of the resistors, for selecting one of voltages at the first and second nodes and the nodes of the resistors and generating one voltage at an output terminal. First and second control voltage circuits are connected to the first and second nodes to control voltages at the first and second nodes to compensate for fluctuations of the voltages at the first and second nodes caused by a fluctuation of the output circuit. Also, first and second current control circuits are connected to the first and second nodes, to control a difference in potential between the first and second nodes at a certain value.

BRIEF DESCRIPTION OF THE DRAWINGS

The present invention will be more clearly understood form the description as set forth below, as compared with the prior art and earlier suggested art, with reference to the accompanying drawings, wherein:

FIG. 15 is a circuit diagram illustrating an eleventh embodiment of the multi-valued voltage generating circuit according to the present invention;

FIGS. 19A and 19B are circuit diagrams illustrating a thirteenth embodiment of the multi-valued voltage generating circuit according to the present invention;

DESCRIPTION OF THE PREFERRED EMBODIMENTS

Before the description of the preferred embodiments, prior art and earlier suggested multi-valued voltage generating circuits will be explained with reference to FIGS. 1, 2 and 3.

Figure 1:
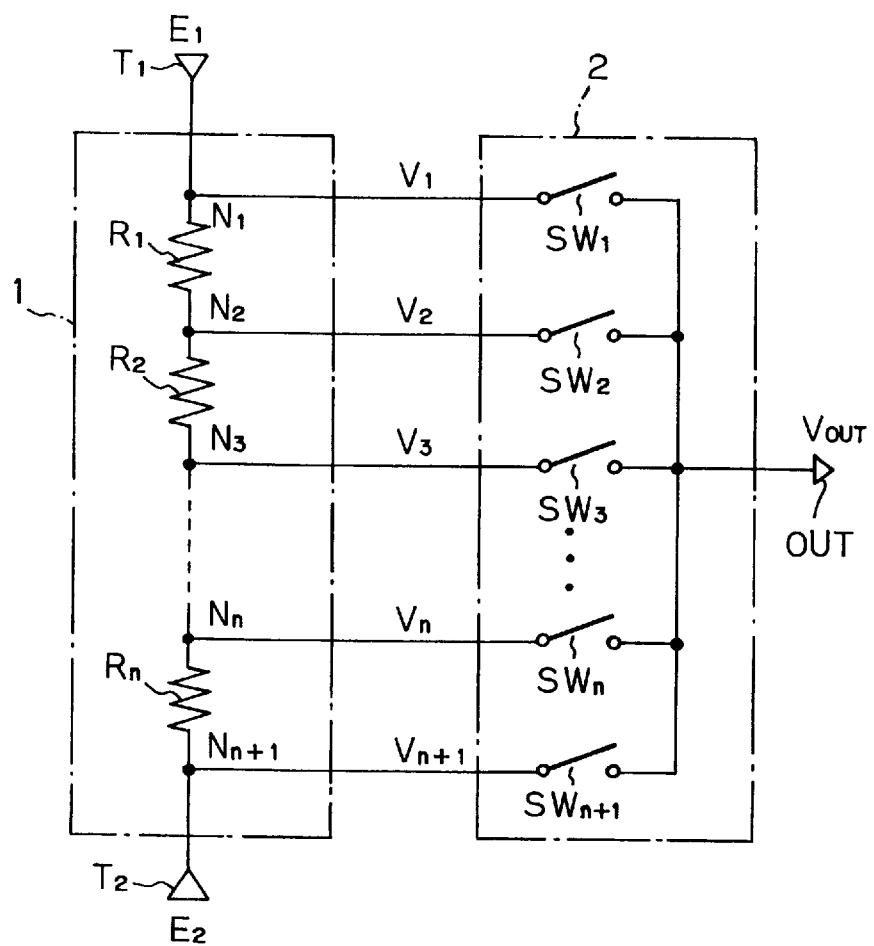
FIG. 1 is a circuit diagram illustrating a first prior art multi-valued voltage generating circuit.

In FIG. 1, which illustrates a first prior art multi-valued voltage generating circuit (see: JP-A-3-264922), a voltage divider 1 formed by resistors $R_1, R_2, \ldots, R_n$ connected in series is connected between power supply terminals $T_1$ and $T_2$ whose voltages are $E_1$ and $E_2$, respectively. Nodes $N_1$, $N_2, \ldots, N_n, N_{n+1}$ of the resistors $R_1, R_2, \ldots, R_n$ are connected via an output circuit 2 formed by switches $SW_1$, $SW_2, \ldots, SW_n, SW_{n+1}$ to an output terminal OUT. In this case, one of the switches $SW_1, SW_2, \ldots, SW_n, SW_{n+1}$ is turned ON. Therefore, an output voltage $V_{OUT}$ at the output terminal OUT has (n+1) values in accordance with the switches $SW_1, SW_2, \ldots, SW_n, SW_{n+1}$. Note that the switches $SW_1, SW_2, \ldots, SW_n, SW_{n+1}$ are formed by MOS switches.

In the multi-valued voltage generating circuit of FIG. 1, however, even when this circuit is formed by a single integrated circuit device, an output impedance is not constant.

Figure 2:
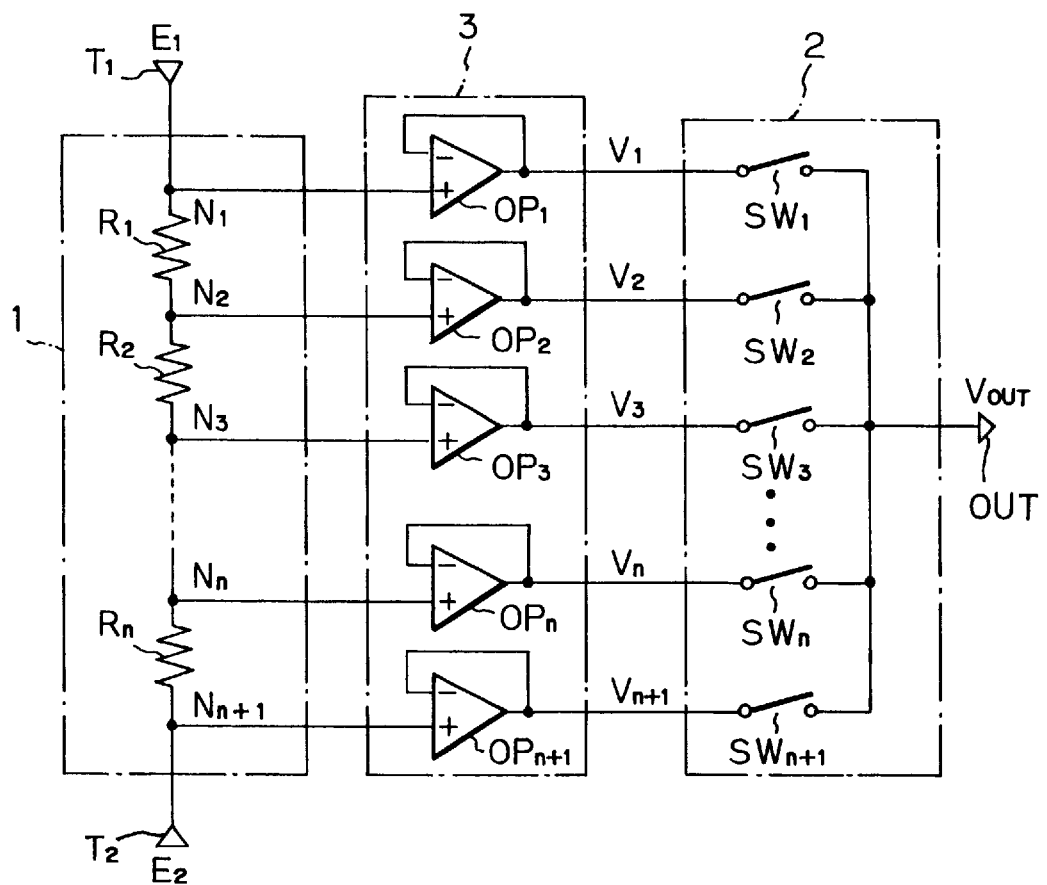
FIG. 2 is a circuit diagram illustrating a second prior art multi-valued voltage generating circuit.

In FIG. 2, which illustrates a second prior art multi-valued voltage generating circuit (see: JP-A-3-274089 and JP-A-3-274090), in order to make the output impedance constant, an impedance transformation circuit 3 formed by voltage followers (operational amplifiers) $OP_1, OP_2, \ldots, OP_n, OP_{n+1}$ is inserted between the voltage divider 1 and the output circuit 2 of FIG. 1.

In the multi-valued voltage generating circuit of FIG. 2, however, if this circuit is formed by a single integrated circuit device, the number of operational amplifiers is increased as the number of multi-valued voltages is increased. Therefore, the chip size is increased, which reduces the manufacturing yield. In addition, steady currents are required for the operational amplifiers, which increases the power dissipation.

Figure 3:
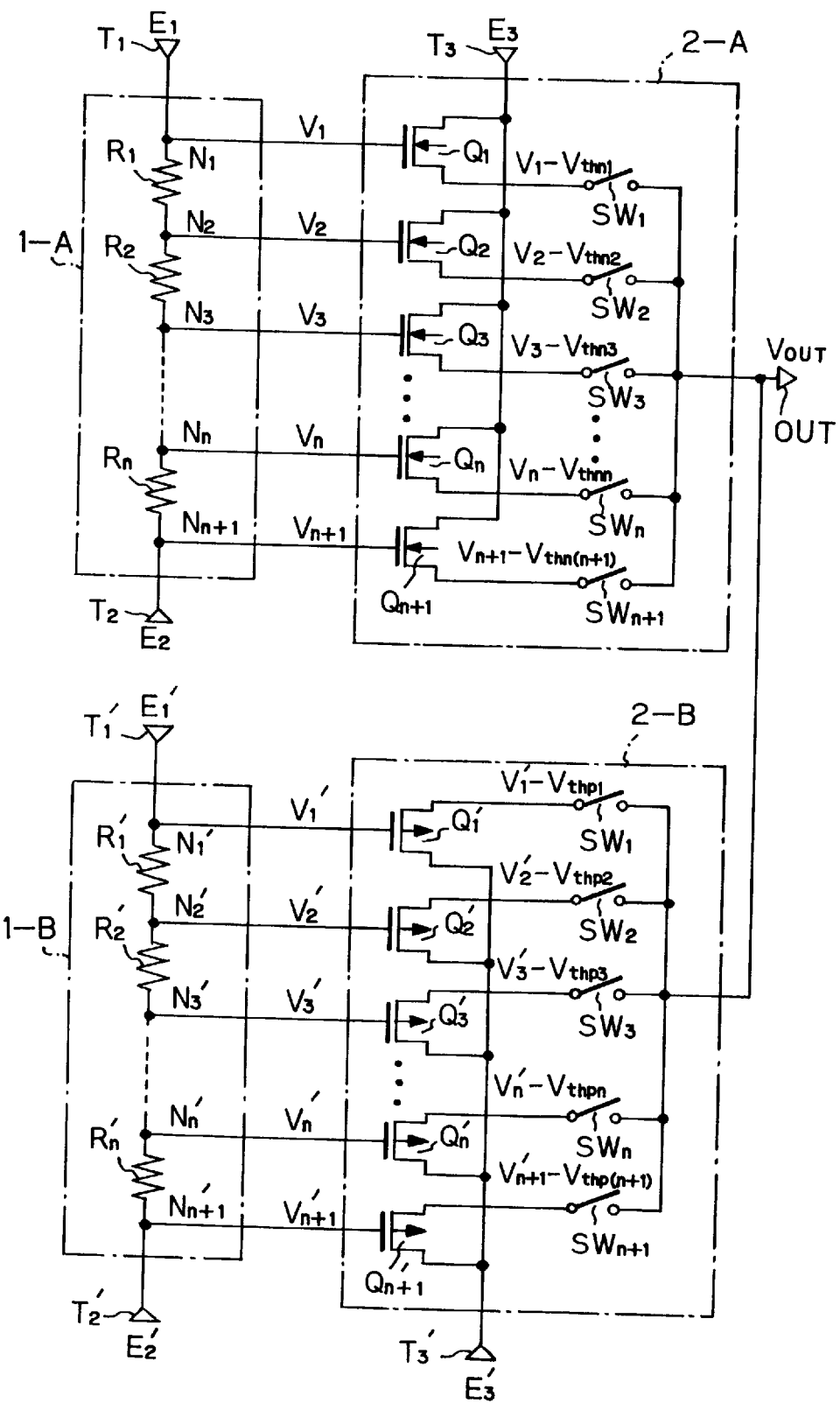
FIG. 3 is a circuit diagram illustrating an earlier suggested multi-valued voltage generating circuit.

In FIG. 3, which illustrates an earlier multi-valued voltage generating circuit suggested by the inventors for a dot-inverting-type LCD apparatus (see: Japanese Patent Application No. 6-699872 filed on Dec. 2, 1994, and published as JP-A-8-160916 on Jun. 21, 1996), MOS transistors are provided instead of the operational amplifiers of FIG. 2. That is, a voltage divider 1-A formed by resistors $R_1, R_2, \ldots, R_n$ connected in series is connected between power supply terminals $T_1$ and $T_2$ whose voltages are $E_1$ and $E_2$, respectively. Nodes $N_1, N_2, \ldots, N_n, N_{n+1}$ of the resistors $R_1$, $R_2, \ldots, R_n$ are connected via an output circuit 2-A formed by N-channel MOS transistors $Q_1, Q_2, \ldots, Q_n, Q_{n+1}$ and switches $SW_1, SW_2, \ldots, SW_n, SW_{n+1}$ to an output terminal OUT. Each of the transistors $Q_1, Q_2, \ldots, Q_n, Q_{n+1}$ forms a source follower. Therefore, when a voltage $V_i$ is applied to the gate of the transistor $Q_i$, the source voltage of the transistor $Q_i$ is $$V_i - V_{thni}$$

where $V_{thni}$ is a threshold voltage of the N-channel MOS transistor $Q_i$. Similarly, a voltage divider 1-B formed by resistors $R_1', R_2', \ldots, R_n'$ connected in series is connected between power supply terminals $T_1'$ and $T_2'$ whose voltages are $E_1'$ and $E_2'$, respectively. Nodes $N_1', N_2', \ldots, N_n', N_{n+1}'$ of the resistors $R_1', R_2', \ldots, R_n'$ are connected via an output circuit 2-B formed by P-channel MOS transistors $Q_1'$, $Q_2', \ldots, Q_n', Q_{n+1}'$ and switches $SW_1', SW_2', \ldots, SW_n'$, $SW_{n+1}'$ to the output terminal OUT. Each of the transistors $Q_1', Q_2', \ldots, Q_n', Q_{n+1}'$ forms a source follower. Therefore, when a voltage $V_j'$ is applied to the gate of the transistor $Q_j'$, the source voltage of the transistor $Q_j'$ is $$V_j - V_{thpj}$$

where $V_{thpj}$ is a threshold voltage of the P-channel MOS transistor $Q_j'$.

In FIG. 3, the voltages $E_1, E_2, E_3, E_1', E_2'$ and $E_3'$ and the threshold voltages of the MOS transistors are adjusted to satisfy the following:

$$V_i - V_{thnj} > V_j' - V_{thpj}$$

In FIG. 3, the source followers formed by the N-channel MOS transistors $Q_1, Q_2, \ldots, Q_{n+1}, Q_n$ pull up the voltage $V_{OUT}$ at the output terminal OUT, and cannot pull down the voltage $V_{OUT}$ at the output terminal OUT. Therefore, if the voltage divider 1-B and the output circuit 2-B are not present, even if one of the switches $SW_1, SW_2, \ldots, SW_n$, $SW_{n+1}$ is turned ON, the corresponding transistor may be turned OFF, so that a desired voltage cannot be obtained at the output terminal OUT. On the other hand, the source followers formed by the P-channel MOS transistors $Q_1'$, $Q_2', \ldots, Q_n', Q_{n+1}'$ pull down the voltage $V_{OUT}$ at the output terminal OUT, and cannot pull up the voltage $V_{OUT}$ at the output terminal OUT. Therefore, if the voltage divider 1-A and the output circuit 2-A are not present, even if one of the switches $SW_1', SW_2', \ldots, SW_n', SW_{n+1}'$ is turned ON, the corresponding transistor may be turned OFF, so that a desired voltage cannot be obtained at the output terminal OUT.

Thus, when the voltage $V_{OUT}$ at the output terminal OUT is required to be higher, one of the switches $SW_1, SW_2, \ldots,$ $SW_n, SW_{n+1}$ is turned ON. On the other hand, when the voltage $V_{OUT}$ at the output terminal OUT is required to be lower, one of the switches $SW_1', SW_2', \ldots, SW_n' \, SW_{n+1}'$ is turned ON.

In the multi-valued voltage generating circuit of FIG. 3, however, when the threshold voltages of the transistors fluctuate due to the manufacturing process, the output voltage $V_{OUT}$ at the output terminal OUT fluctuates.

Figure 4:
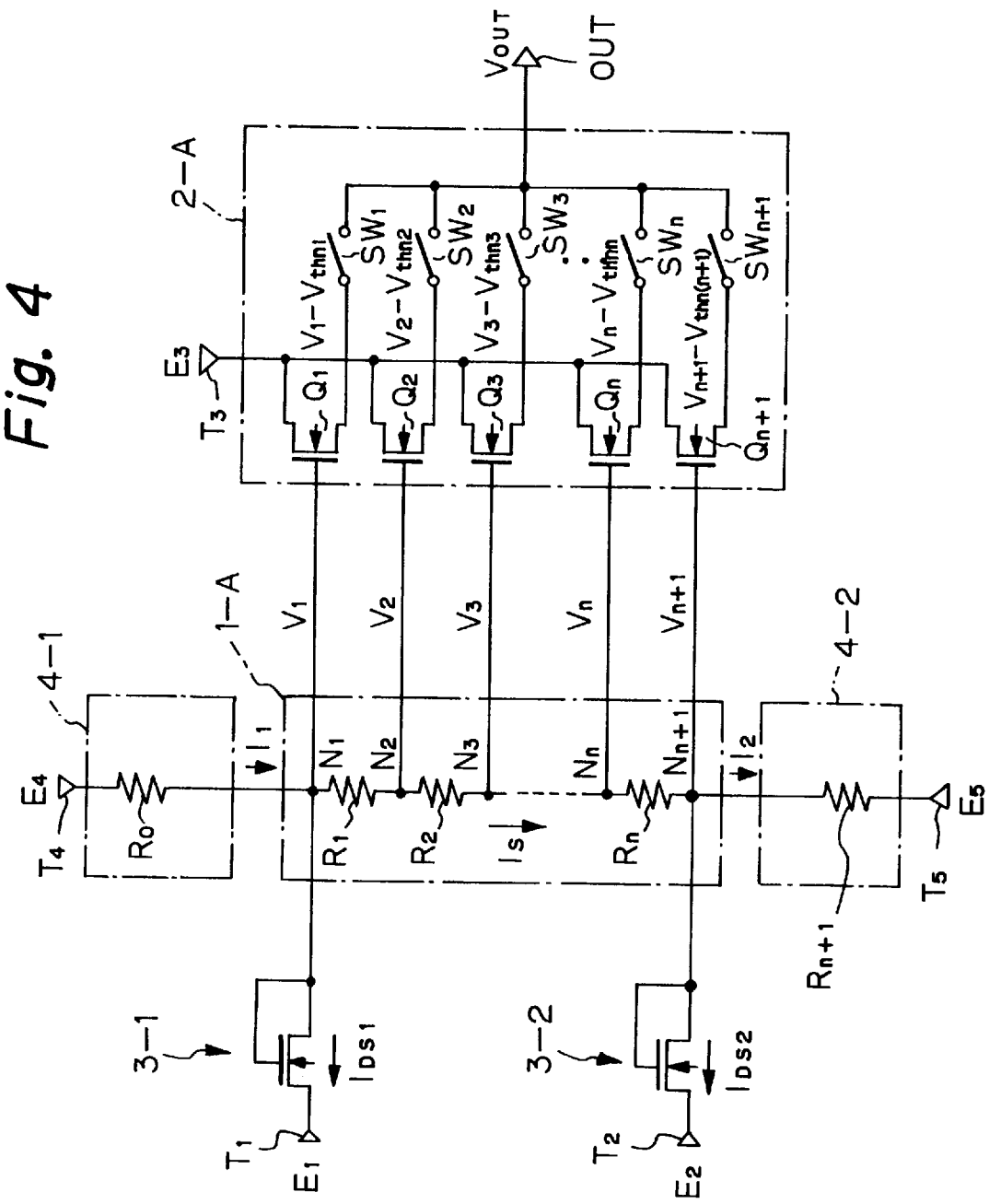
FIG. 4 is a circuit diagram illustrating a first embodiment of the multi-valued voltage generating circuit according to the present invention.

In FIG. 4, which illustrates a first embodiment of the present invention, voltage control circuits 3-1 and 3-2 and current control circuits 4-1 and 4-2 are added to the voltage divider 1-A and the output circuit 2-A of FIG. 3, and the voltage divider 1-B and the output circuit 2-B of FIG. 3 are not provided.

Each of the voltage control circuits 3-1 and 3-2 is formed by an N-channel MOS transistor. Therefore, the voltages $V_1$ and $V_{n+1}$ at nodes $N_1$ and $N_{n+1}$ are caused to be $$V_1 = E_1 + V_{GS1} \quad (1)$$

$$V_{n+1} = E_2 + V_{GS2} \quad (2)$$

where $V_{GS1}$ and $V_{GS2}$ are gate-source voltages of the N-channel transistors of the voltage control circuits 3-1 and 3-2, respectively. Also, each of the current control circuits 4-1 and 4-2 is formed by resistors $R_0$ and $R_{n+1}$ connected to terminals $T_4$ and $T_5$ whose voltages are $E_4$ and $E_5$, respectively. In this case, $$E_4 > E_1 + V_{GS1} \tag{3}$$

$$E_5 < E_2 + V_{GS2} \tag{4}$$

The current control circuits 4-1 and 4-2 will be explained later in detail.

Figure 5:
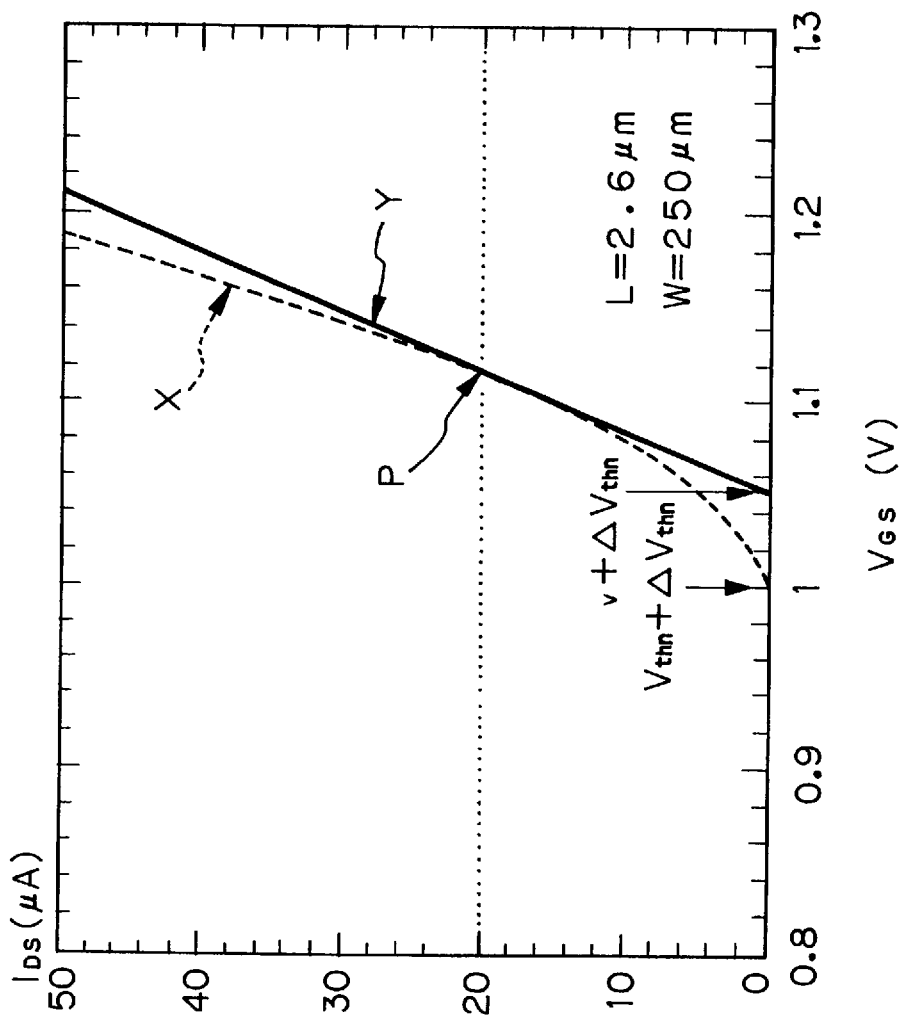
FIG. 5 is a graph showing the operation of the N-channel MOS transistors of FIG. 4.

The operation of the circuit of FIG. 4 is explained next. Here, assume that the fluctuation of characteristics of the N-channel MOS transistors depends on only the fluctuation of threshold voltages thereof, and all the N-channel MOS transistors have the same fluctuation of characteristics. Under such a condition, if the N-channel MOS transistors operate in a saturation region (pentode region), the N-channel MOS transistors operate steadily along a characteristic curve X as shown in FIG. 5. In this case, if the fluctuation of characteristics of the N-channel MOS transistors is small around an operating point P in FIG. 5, the characteristic curve X can be approximated to a characteristic line Y as shown in FIG. 5. In FIG. 5, $V_{thn}$ is a threshold voltage of the N-channel MOS transistors without the fluctuation of characteristics;

$\Delta V_{thn}$ is a shift amount of the threshold voltage $V_{thn}$ of the N-channel MOS transistors by the fluctuation of characteristics;

$I_{DS}$ is a drain to source current;

$v + \Delta V_{thn}$ is an intercept of the characteristic line Y to the $V_{GS}$ axis; and $\gamma$ is a slope of the characteristic line Y relative to the $I_{DS}$ axis.

The operating point P can be represented by $$V_{GS} = v + \Delta V_{thn} + I_{DS} \cdot \gamma \tag{5}$$

Therefore, the operating point P of the N-channel MOS transistors of the voltage control circuits 3-1 and 3-2 can be represented by $$V_{GS1} = v_1 + \Delta V_{thn} + I_{DS1} \cdot \gamma_1 \tag{6}$$

$$V_{GS2} = v_2 + \Delta V_{thn} + I_{DS2} \cdot \gamma_2 \tag{7}$$

In view of the equations (1) and (2), $$V_1 = E_1 + v_1 + \Delta V_{thn} + I_{DS1} \cdot \gamma_1 \tag{8}$$

$$V_{n+1} = E_2 + v_2 + \Delta V_{thn} + I_{DS2} \cdot \gamma_2 \tag{9}$$

If a resistance between the nodes $N_1$ and $N_i$ is RA $(= R_1 + R_2 + \ldots + R_i)$ and a resistance between the nodes $N_i$ and $N_{n+1}$ is RB $(= R_{i+1} + R_{i+2} + \ldots + R_{n+1})$ the voltage $V_i$ at the node $N_i$ can be represented by $$V_i = [RA \cdot (E_2 + v_2 + I_{DS2} \cdot \gamma^2) + \tag{10}$$
$$RB(E_1 + v_1 + I_{DS1} \cdot \gamma^1)]/$$
$$(RA + RB) +$$
$$\Delta V_{thn}$$

Therefore, if only the switch $SW_i$ is turned ON, the output voltage $V_{OUT}$ at the output terminal OUT can represented by $$V_{OUT} = V_i - (V_{thni} + \Delta V_{thn}) \tag{11}$$
$$= [RA \cdot (E_2 + v_2 + I_{DS2} \cdot \gamma^2) +$$
$$RB(E_1 + v_1 + I_{DS4} \cdot \gamma^1)]/$$
$$(RA + RB) -$$
$$V_{thni}$$

Thus, since the term $\Delta V_{thn}$ is cancelled in the formula (11), the output voltage $V_{OUT}$ at the output terminal OUT is not directly affected by the fluctuation $\Delta V_{thn}$ of the threshold voltage $V_{thn}$. Note that the values $I_{DS1}$ and $I_{DS2}$ depending upon the fluctuation of characteristics of the N-channel MOS transistors affect the output voltage $V_{OUT}$ at the output terminal OUT. In this case, however, if the ratio of a channel width W to a channel length L of the transistors of the voltage control circuits 3-1 and 3-2 is made sufficiently large, the values $\gamma_1$ and $\gamma_2$ can be small. In addition, if the current control circuits 4-1 and 4-2 are operated so that, the fluctuations of the values $I_{DS1}$ and $I_{DS2}$ are made small, the fluctuations $\Delta(I_{DS1} \cdot \gamma_1)$ and $\Delta(I_{DS2} \cdot \gamma_2)$ are made small, and as a result, the output voltage $V_{OUT}$ at the output terminal OUT is hardly affected by the fluctuation of characteristics of the N-channel MOS trnsistors. This description is also true for the P-channel MOS transistors.

Figure 6:
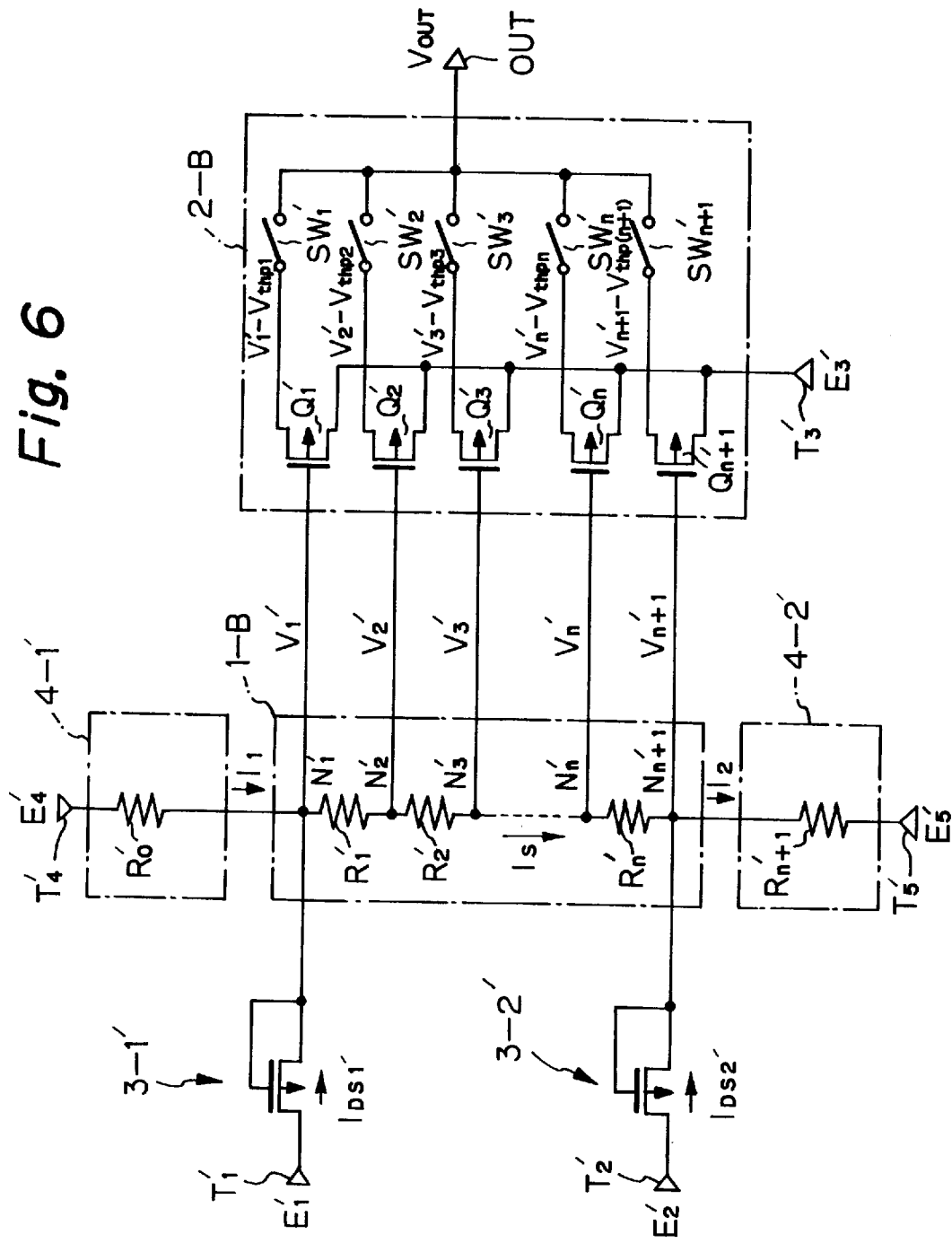
FIG. 6 is a circuit diagram illustrating a second embodiment of the multi-valued voltage generating circuit according to the present invention.

In FIG. 6, which illustrates a second embodiment of the present invention, the N-channel MOS transistors are replaced by P-channel MOS transistors. That is, voltage control circuits 3-1' and 3-2' and current control circuits 4-1' and 4-2' are added to the voltage divider 1-B and the output circuit 2-B of FIG. 3, and the voltage divider 1-A and the output circuit 2-A of FIG. 3 are not provided. Note that the current control circuits 4-1' and 4-2' will also be explained later in detail.

Each of the voltage control circuits 3-1' and 3-2' is formed by a P-channel MOS transistor. Therefore, the voltages $V_1'$ and $V_{n+1}'$ at nodes $N_1'$ and $N_{n+1}'$ are caused to be $$V_1' = E_1' + V_{GS1}' \tag{12}$$

$$V_{n+1}' = E_2' + V_{GS2}' \tag{13}$$

In this case, the gate-source voltages of the P-channel transistors of the voltage control circuits 3-1' and 3-2' are negative. Also, $$E_4' > E_1' + V_{GS1}' \tag{14}$$

$$E_5' < E_2' + V_{GS2}' \tag{15}$$

The operation of the circuit of FIG. 6 is similar to that of the circuit of FIG. 4. Thus, the output voltage $V_{OUT}$ at the output terminal OUT is hardly affected by the fluctuation of characteristics of the P-channel MOS transistors and the resistors.

Figure 7:
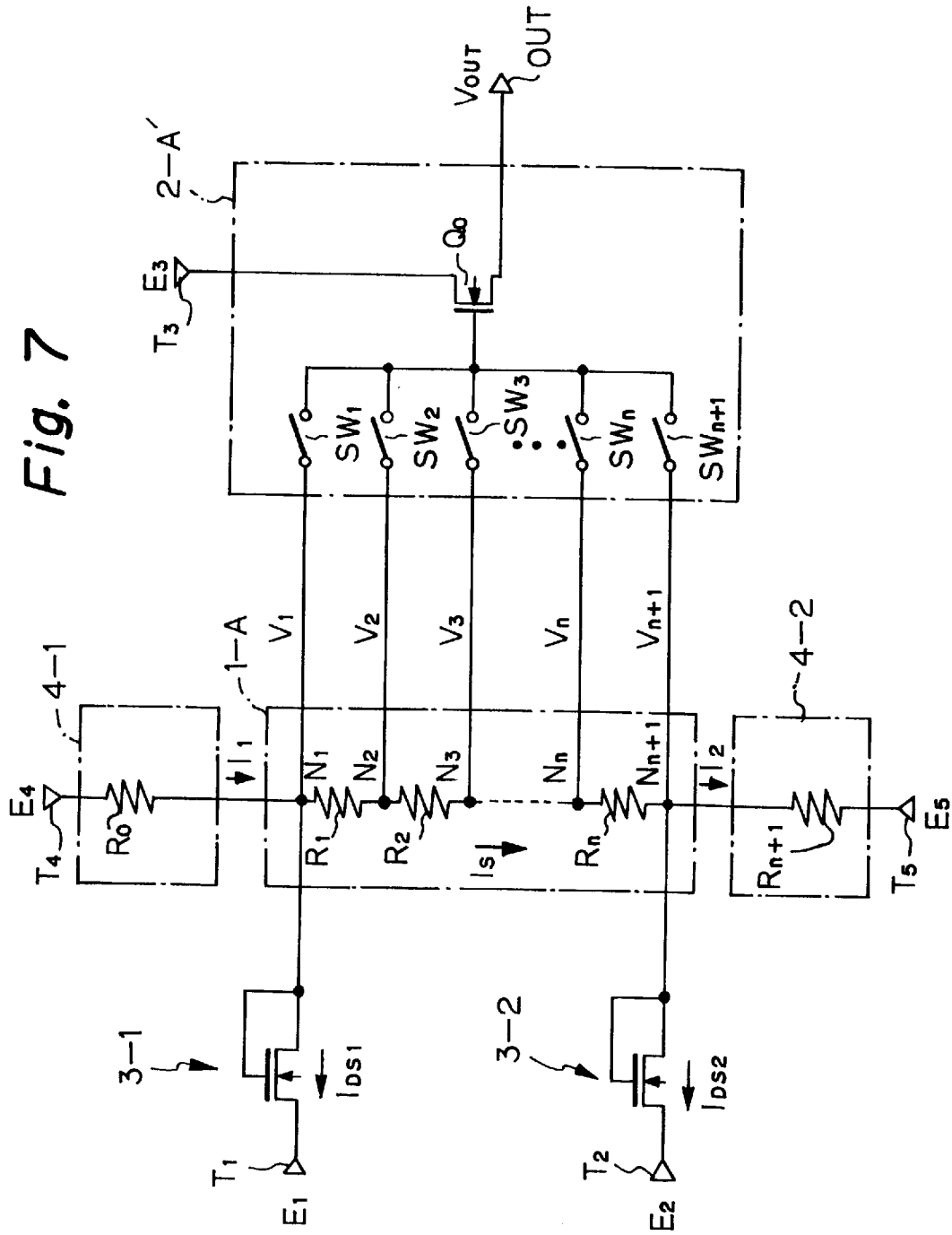
FIG. 7 is a circuit diagram illustrating a third embodiment of the multi-valued voltage generating circuit according to the present invention.

In FIG. 7, which illustrates a third embodiment of the present invention, the output circuit 2-A of FIG. 4 is modified into an output circuit 2-A'. That is, in the output circuit 2-A', an N-channel MOS transistor $Q_0$ is provided instead of the N-channel MOS transistors $Q_1, Q_2, \ldots, Q_{n+1}$, of the output circuit 2-A of FIG. 4, thus simplifying the circuit configuration. Also, since no MOS switch is interposed between the source of the transistor $Q_0$ and the output terminal OUT, an output impedance can be reduced. Even in FIG. 7, if only the switch $SW_i$ is turned ON, the output voltage $V_{OUT}$ at the output terminal OUT can be represented by the equation (11). Therefore, the description for FIG. 4 is true for FIG. 7, and the output voltage $V_{OUT}$ at the output terminal OUT is hardly affected by the fluctuation of characteristics of the N-channel MOS transistors and the resistors.

Figure 8:
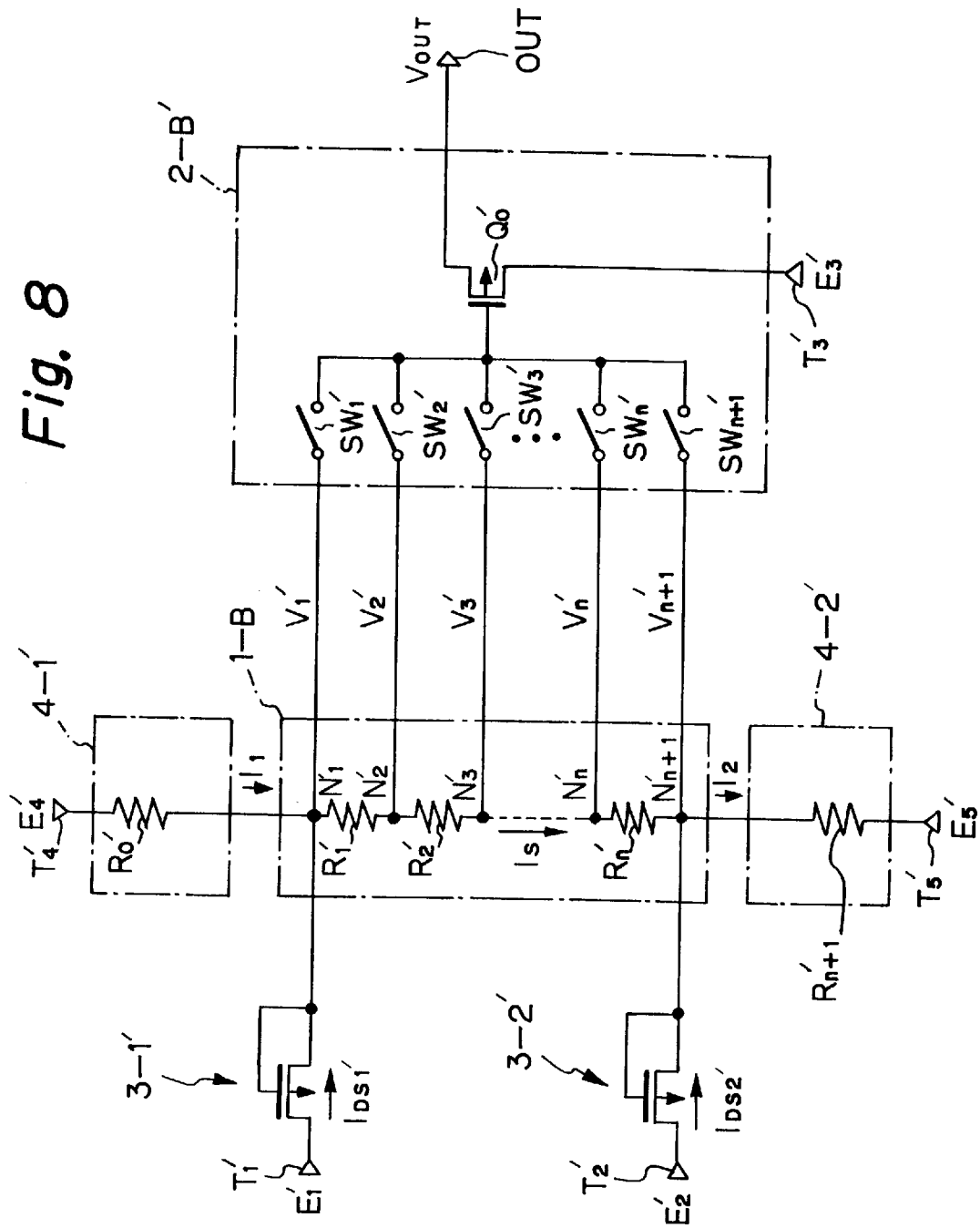
FIG. 8 is a circuit diagram illustrating a fourth embodiment of the multi-valued voltage generating circuit according to the present invention.

In FIG. 8, which illustrates a fourth embodiment of the present invention, the output circuit 2-B of FIG. 6 is modified into an output circuit 2-B'. That is, in the output circuit 2-B', a P-channel MOS transistor $Q_0'$ is provided instead of the P-channel MOS transistors $Q_1', Q_2', \ldots, Q_{n+1}'$ of the output circuit 2-B of FIG. 6, thus simplifying the circuit configuration. Also, since no MOS switch is interposed between the source of the transistor $Q_0'$ and the output terminal OUT, an output impedance can be reduced. Even in FIG. 8, if only the switch $SW_i'$ is turned ON, the output voltage $V_{OUT}$ at the output terminal OUT can be represented by an equation for the P-channel MOS transistors similar to the equation (11) for the N-channel MOS transistors. Therefore, the output voltage $V_{OUT}$ at the output terminal OUT is hardly affected by the fluctuation of characteristics of the P-channel MOS transistors.

Figure 9:
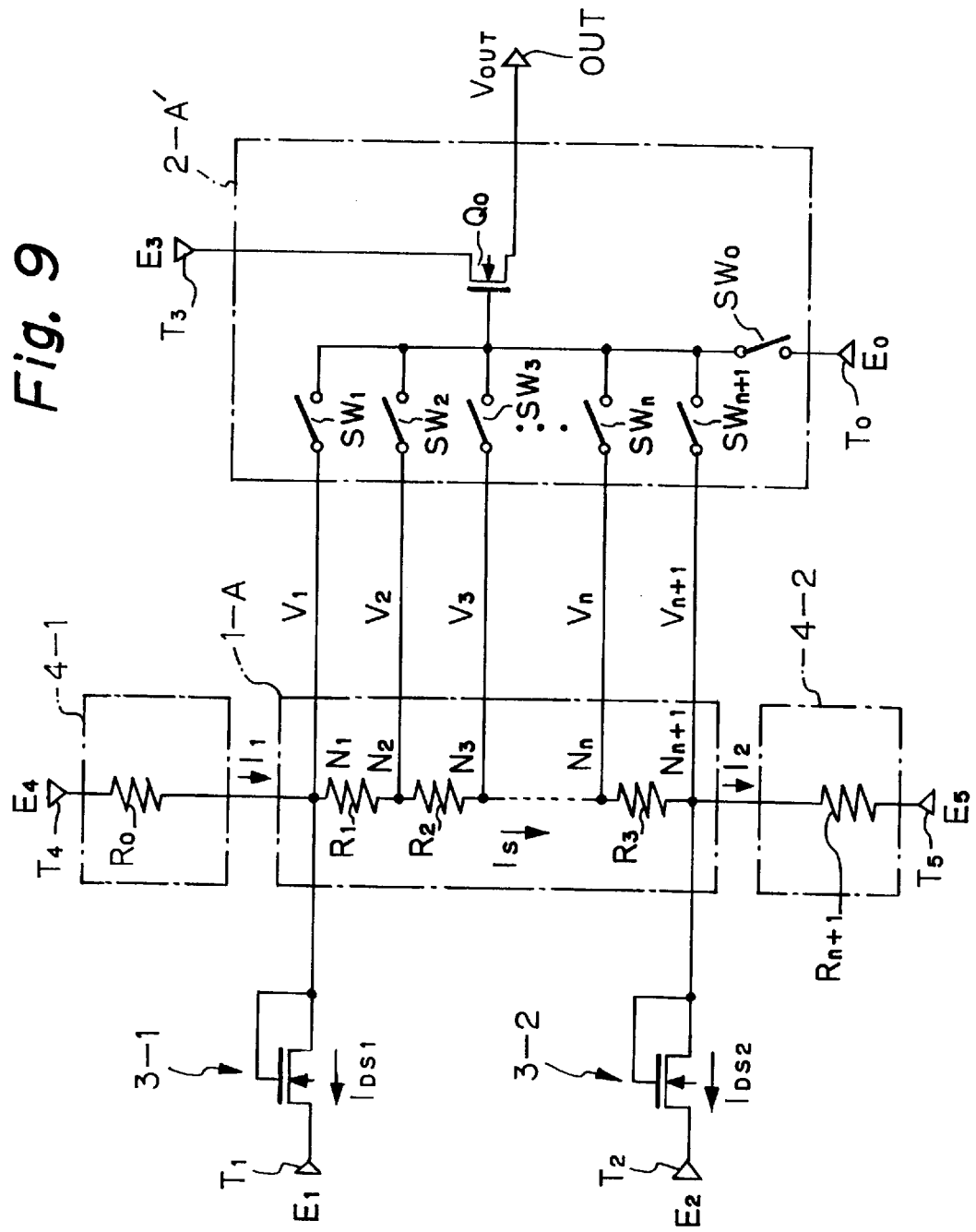
FIG. 9 is a circuit diagram illustrating a fifth embodiment of the multi-valued voltage generating circuit according to the present invention.

In FIG. 9, which illustrates a fifth embodiment of the present invention, a switch $SW_0$ connected to a power supply terminal $T_6$ is connected to the gate of the transistor $Q_0$ of the output circuit 2-A' of FIG. 7. Thus, the output terminal OUT can be shut OFF by the turning ON the switch $SW_0$ regardless of the states of the switches $SW_1, SW_2, \ldots, SW_{n+1}$. Note that the voltage at the voltage supply terminal $T_0$ is defined by $E_0$.

Figure 10:
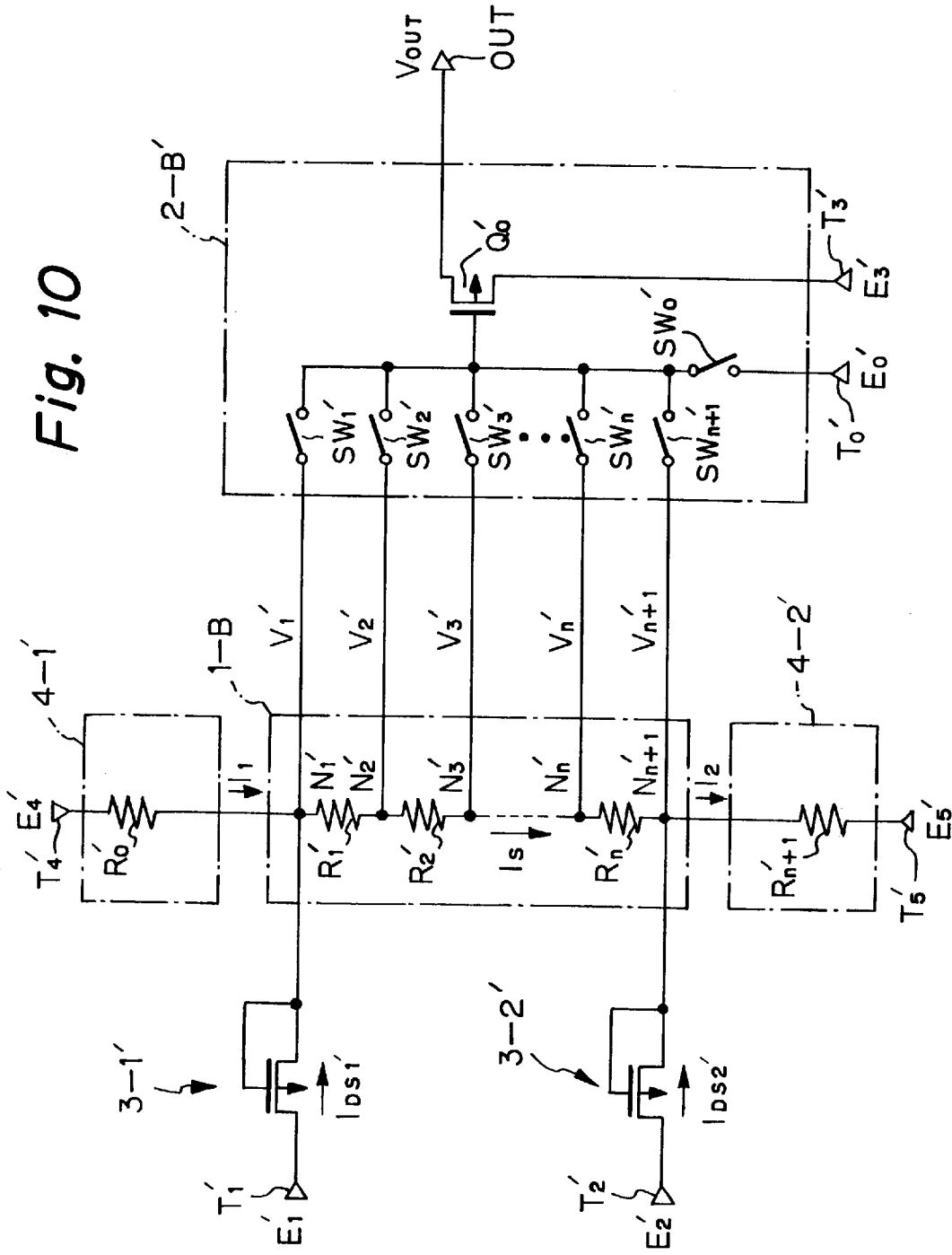
FIG. 10 is a circuit diagram illustrating a sixth embodiment of the multi-valued voltage generating circuit according to the present invention.

In FIG. 10, which illustrates a sixth embodiment of the present invention, a switch $SW_0'$ connected to a power supply terminal $T_0'$ is connected to the gate of the transistor $Q_0'$ of the output circuit 2-B' of FIG. 8. Thus, the output terminal OUT can be shut OFF by turning ON the switch $SW_0'$ regardless of the states of the switches $SW_1', SW_2', \ldots, SW_{n+1}'$. Note that the voltage at the voltage supply terminal $T_0'$ is defined by $E_0'$.

Next, the current control circuits 4-1 and 4-2 of FIGS. 4, 7 and 9 are explained. Here, the resistors $R_0$ and $R_{n+1}$ are manufactured simultaneously with the resistors $R_1, R_2, \ldots, R_n$.

A difference $V_S$ in potential between the nodes $N_1$ and $N_{n+1}$ can be represented by $$V_S = (1+\alpha) \cdot R_S \cdot I_S \tag{16}$$

where $R_S = R_1 + R_2 + \ldots + R_n$;

$\alpha$ is a fluctuation of the resistance by the manufacturing process; and $I_S$ is a current flowing through the voltage divider 1-A, i.e., a current flowing from the node $N_1$ to the node $N_{n+1}$.

Since the N-channel MOS transistors of the voltage control circuits 3-1 and 3-2 have the same configuration, $\gamma_1 = \gamma_2$ and $v_1 = v_2$. Also, if the ratio W/L of the transistors of the voltage control circuits 3-1 and 3-2 is sufficiently large, the value $\gamma_1 (= \gamma_2)$ is sufficiently small. In this case, from the equations (8) and (9), the difference $V_S$ can be represented by $$\begin{aligned} V_S &= (E_1 + v_1 + \Delta V_{thn} + I_{DS1} \cdot \gamma^1) - \\ &\quad (E_2 + v_2 + \Delta V_{thn} + I_{DS2} \cdot \gamma^2) \\ &= E_1 - E_2 + (I_{DS1} - I_{DS2}) \cdot \gamma^1 \end{aligned} \tag{17}$$

If the fluctuation of characteristics of the transistors of the voltage control circuits 3-1 and 3-2 is small, the currents $I_{DS1}$ and $I_{DS2}$ are close to the operating point P along the characteristic line Y as shown in FIG. 5. As a result, term $(I_{DS1} - I_{DS2}) \cdot \gamma_1$ in the equation (17) can be neglible compared with the term $(E_1 - E_2)$. Thus, the equation (17) can be replaced by $$V_S = E_1 - E_2 \tag{18}$$

From the equations (16) and (18), $$\begin{aligned} I_S &= (E_1 - E_2)/[(1+\alpha) \cdot R_S] \\ &= I_{So}/(1+\alpha) \end{aligned} \tag{19}$$

Here, $I_{So}$ is a value of the current $I_S$ when $\alpha=0$.

Thus, the current $I_S$ can be determined regardless of the values of the resistors $R_0$ and $R_{n+1}$.

Since the nodes $N_1, N_2, \ldots, N_{n+1}$ are connected to the gates of the MOS transistors of the output circuit 2-A, currents flowing between the voltage divider 1-A and the output circuit 2-A can be neglible. Therefore, a current $I_1$ flowing from the current control circuit 4-1 to the voltage divider 1-A can be represented by $$I_1 = I_S + I_{DS1} \tag{20}$$

Therefore, the voltage $V_1$ at the node $N_1$ can be represented by $$V_1 = E_4 - (1+\alpha) \cdot R_0 \cdot (I_S + I_{DS1}) \tag{21}$$

From the equations (8), (19) and (21), $$I_{DS1} = R_0/[(1+\alpha) \cdot R_0 + \gamma_1] \cdot [(E_4 - E_1 - v_1 - \Delta V_{thn})/R_0 - I_{so}] \tag{22}$$

Similarly, a current $I_2$ flowing from the voltage divider 1-A to the current control circuit 4-2 can be represented by $$I_2 = I_S - I_{DS2} \tag{23}$$

Therefore, the voltage $V_{n+1}$ at the node $N_{n+1}$ can be represented by $$V_{n+1} = E_5 + (1+\alpha) \cdot R_{n+1} \cdot (I_S - I_{DS2}) \tag{24}$$

From the equations (9), (19) and (24), under the condition that $\gamma_1 = \gamma_2$ and $v_1 = v_2$, $$I_{DS2} = R_{n+1}/[(1+\alpha) \cdot R_{n+1} + \gamma_1] \cdot [(E_5 - E_2 - v_1 - \Delta V_{thn})/R_{n+1} + I_{so}] \tag{25}$$

Since the fluctuation of the output voltage $V_{OUT}$ at the output terminal OUT depends upon the fluctuation of the currents $I_{DS1}$ and $I_{DS2}$ from the equation (11), if the fluctuation of the currents $I_{DS1}$ and $I_{DS2}$ is made smaller, the fluctuation of the output voltage $V_{OUT}$ is made smaller.

From the equations (22) and (25), if the resistance values of the resistors $R_0$ and $R_{n+1}$ are much larger than the fluctuation $\Delta V_{thn}$, the fluctuation of the currents $I_{DS1}$ and $I_{DS2}$ can be suppressed. Also, in this case, the absolute values of the currents $I_{DS1}$ and $I_{DS2}$ per se can be reduced, and as a result, the fluctuation of the currents $I_{DS1}$ and $I_{DS2}$ due to the fluctuation of the coefficient α can be reduced. Further, the operating point P of the N-channel MOS transistors as shown in FIG. 5 is set in advance, so that the values of the currents $I_{DS1}$ and $I_{DS2}$ at the operating point P are small, which suppresses the fluctuation of the currents $I_{DS1}$ and $I_{DS2}$.

Thus, the output voltage $V_{OUT}$ at the output terminal OUT is hardly affected by the fluctuation of characteristics of the N-channel MOS transistors and the resistors.

Figure 11:
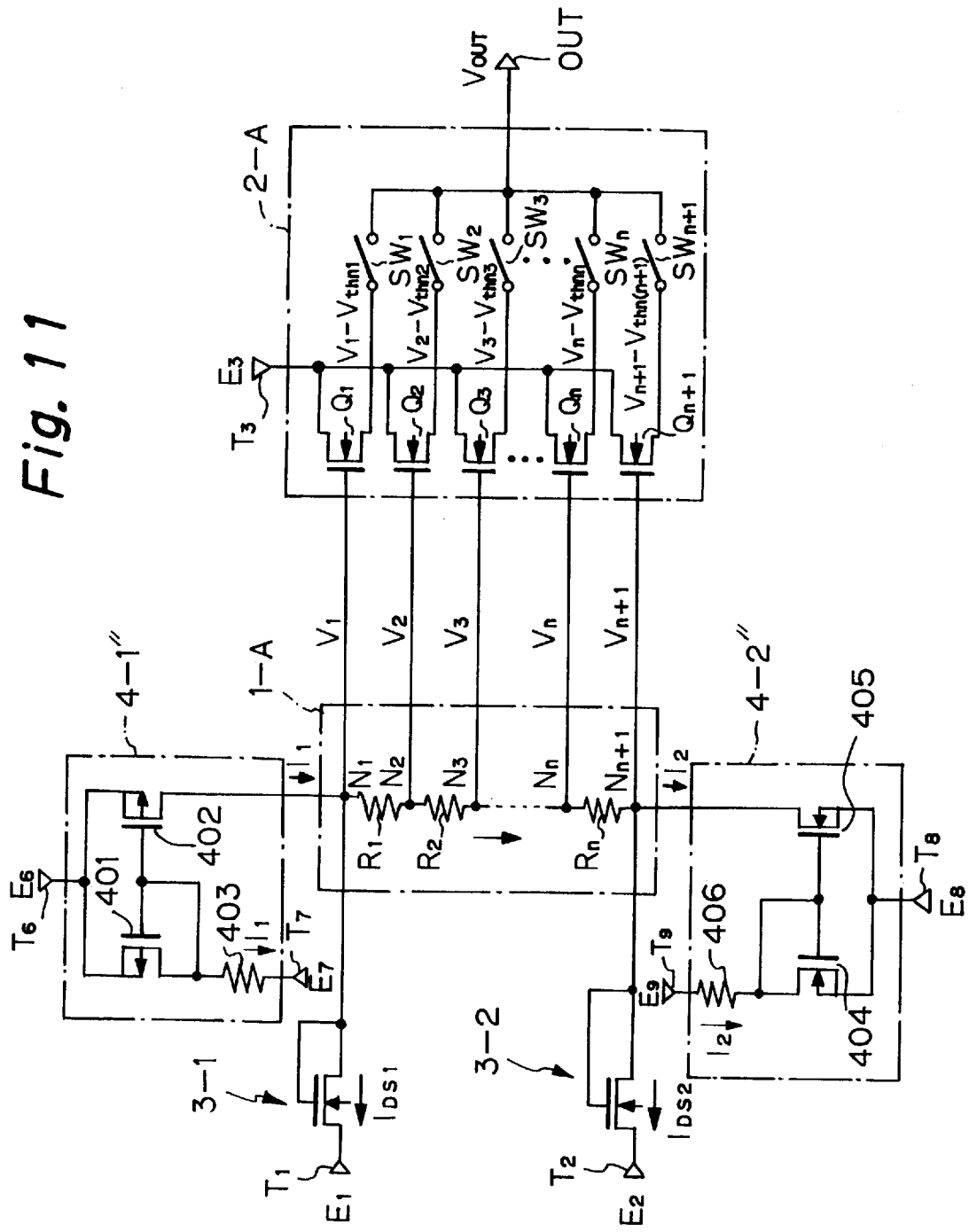
FIG. 11 is a circuit diagram illustrating a seventh embodiment of the multi-valued voltage generating circuit according to the present invention.

In FIG. 11, which illustrates a seventh embodiment of the present invention, the current control circuits 4-1 and 4-2 of FIG. 4 are modified into current control circuits 4-1" and 4-2", respectively.

The current control circuit 4-1" includes two P-channel MOS transistors 401 and 402 forming a current mirror circuit, and a resistor 403. In this case, the sources of the transistors 401 and 402 are connected to a power supply terminal $T_6$ whose voltage is $E_6$. Also, the drain and gate of the transistor 401 as well as the gate of the transistor 402 are connected to the resistor 403 which is further connected to a power supply terminal $T_7$ whose voltage is $E_7$. Further, the drain of the transistor 402 is connected to the voltage divider 1-A.

Similarly, the current control circuit 4-2" includes two N-channel MOS transistors 404 and 405 forming a current mirror circuit, and a resistor 406. In this case, the sources of the transistors 404 and 405 are connected to a power supply terminal $T_8$ whose voltage is $E_8$. Also, the drain and gate of the transistor 404 as well as the gate of the transistor 405 are connected to the resistor 406 which is further connected to a power supply terminal $T_9$ whose voltage is $E_9$. Further, the drain of the transistor 405 is connected to the voltage divider 1-A.

The resistors 403 and 406 are manufactured simultaneously with the resistors $R_1, R_2, \ldots, R_n$. Therefore, the resistors 403 and 406 can serve as sensors for sensing the fluctuation of the resistance values of the resistors $R_1, R_2, \ldots, R_n$.

In the current control circuit 4-1", the following equation is satisfied:

$$E_6 = E_7 + (1+\alpha) \cdot R(403) \cdot I_1 - V_{GS}(401) \tag{26}$$

$$I_1 = -I_{DS}(402) = -I_{DS}(401) \tag{27}$$

where

R(403) is a resistance value of the resistor 403;

$V_{GS}(401)$ is a gate-to-source voltage of the transistor 401, which is in this case negative.

$I_{DS}(401)$ and $I_{DS}(402)$ are drain-to-source currents of the transistors 401 and 402, respectively.

From the equations (5), (19), (20), (26) and (27), $$I_{DS1} = (E_6 - E_7 + v(401) + \Delta V_{thp})/ \tag{28}$$
$$[(1+\alpha) \cdot R(403) + \gamma(401)] -$$
$$I_{So}/(1+\alpha)$$

$$I_2 = I_{DS}(405) = I_{DS}(404) \tag{29}$$

where $v(401)$, and $\gamma(401)$ are the values v and γ for the transistor 401; and $\Delta V_{thp}$ is a shift amount of the threshold voltage of the P-channel transistors by the fluctuations of characteristics.

Similarly, in the current control circuit 4-2", the following equation is satisfied:

$$E_9 = E_8 + (1+\alpha) \cdot R(406) \cdot I_2 - V_{GS}(404) \tag{29}$$

$$I_2 = I_{DS}(405) = I_{DS}(404) \tag{30}$$

where

R(406) is a resistance value of the resistor 406;

$V_{GS}(404)$ is a gate-to-source voltage of the transistor 404, which is in the case positive.

From the equations (5), (19), (23), (26) and (30), $$I_{DS}^2 = (E_8 + E_9 + v(404) + \Delta V_{thn})/ \tag{31}$$
$$[(1+\alpha) \cdot R(406) + \gamma(404)] +$$
$$I_{So}/(1+\alpha)$$

where $v(404)$ and $\gamma(404)$ are values v and γ for the transistor 404.

Also, since the fluctuation of the output voltage $V_{OUT}$ at the output terminal OUT depends upon the fluctuation of the currents $I_{DS1}$ and $I_{DS2}$ from the equation (11), if the fluctuation of the currents $I_{DS1}$ and $I_{DS2}$ is made smaller, the fluctuation of the output voltage $V_{out}$ is made smaller. From the equations (28) and (31), if the resistance values of the resistors 403 and 406 are much larger than the fluctuations $\Delta V_{thn}$ and $\Delta V_{thp}$ and the value of the current $I_{So}$ is reduced, the fluctuation of the currents $I_{DS1}$ and $I_{DS2}$ can be suppressed. Also, in this case, the absolute values of the currents $I_{DS1}$ and $I_{DS2}$ per se can be reduced, and as a result, the fluctuation of the currents $I_{DS1}$ and $I_{DS2}$ due to the fluctuation of the coefficient α can be reduced. Further, the operating point P of the N-channel MOS transistors as shown in FIG. 5 is set in advance, so that the values of the currents $I_{DS1}$ and $I_{DS2}$ at the operating point P are small, which suppresses the fluctuation of the currents $I_{DS1}$ and $I_{DS2}$.

In FIG. 11, note that other constant current sources can be used instead of the current mirror circuits.

Also, the current control circuits 4-1" and 4-2" of FIG. 11 can be applied to the circuits of FIGS. 6, 7, 8, 9 and 10.

Thus, in FIG. 11, the output voltage $V_{OUT}$ at the output terminal OUT is hardly affected by the fluctuation of characteristics of the N-channel and P-channel transistors and the resistors $R_0, R_1, \ldots, R_{n+1}$.

Figure 12:
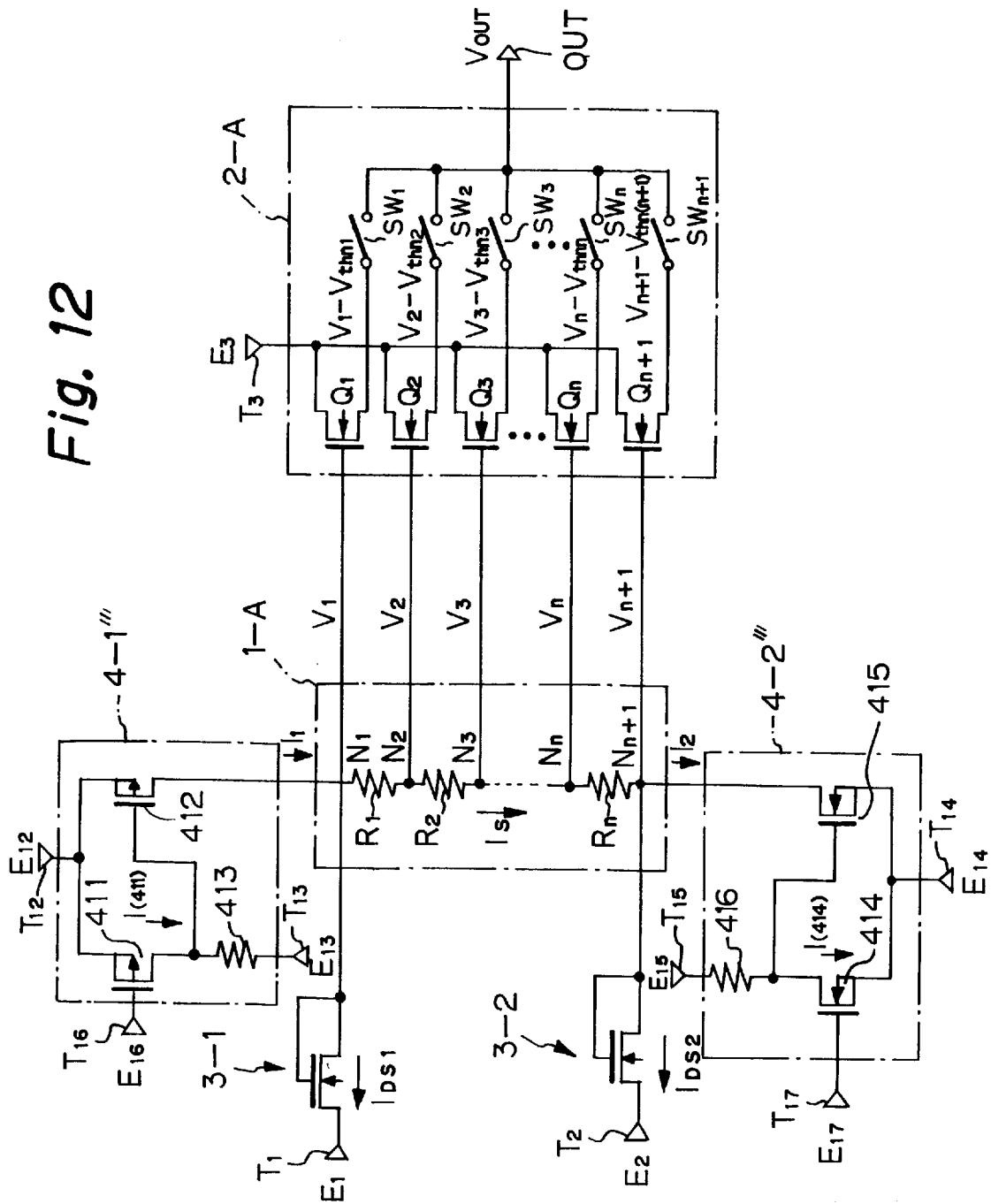
FIG. 12 is a circuit diagram illustrating an eighth embodiment of the multi-valued voltage generating circuit according to the present invention.

In FIG. 12, which illustrates an eighth embodiment of the present invention, the current control circuits 4-1" and 4-2" of FIG. 11 are modified into current control circuits 4-1'" and 4-2'", respectively.

In the current control circuit 4-1'", the gate of the transistor 411 is connected to a power supply terminal $T_{16}$ whose voltage is $E_{16}$. As a result, an almost constant current I (413) flows through the resistor 413. Similarly, in the current control circuit 4-2'", the gate of the transistor 414 is connected to a power supply terminal $T_{17}$ whose voltage is $E_{17}$. As a result, an almost constant current I (416) flows through the resistor 416. Also, in FIG. 12, the resistors 413 and 416 are manufactured simultaneously with the resistors $R_1, R_2, \ldots, R_n$. Therefore, the resistors 413 and 416 can serve as sensors for sensing the fluctuation of the resistance values of the resistors $R_1, R_2, \ldots, R_n$.

In the current control circuit 4-1'", the following equation is satisfied:

$$E_{12} = E_{13} + (1+\alpha) \cdot R(413) \cdot I(413) - V_{GS}(412) \tag{32}$$

$$V_{GS}(411) = E_{16} - E_{12} \tag{33}$$

$$I_1 = I_{DS}(412) \tag{34}$$

$$I(413) = -I_{DS}(411) \tag{35}$$

From the equations (5), (19), (20), (32), (33), (34) and (35), $$\begin{aligned} I_{DS}^1 &= 1/\gamma(412) \cdot \\ &\quad [E_{12} - E_{13} + v(412) + \Delta V_{thp}) + \\ &\quad (1 + \alpha) \cdot R(413)/\gamma(411) \cdot \\ &\quad (E_{16} - E_{12} - v(411) - \Delta V_{thp})] - \\ &\quad I_{So}/(1 + \alpha) \end{aligned} \tag{36}$$

where v(412) is the value v for the transistor 412.

If R (413)=γ(411) and $$1/(1+\alpha) \approx 1 - \alpha + \alpha^2,$$

then, the equation (36) can be replaced by $$I_{DS}^1 = (E_{16} - E_{13} + v(412) - v(411))/\gamma(412) - \tag{37}$$
$$I_{So} + \alpha \cdot [(E_{16} - E_{12} - v(411) - \Delta V_{thp})/\gamma(412) + I_{So}] - \alpha^2 \cdot I_{So}$$

Further, if $$I_{So} = -(E_{16} - E_{12} - v(411))/\gamma(412) \tag{38}$$

then, the equation (37) can be replaced by $$\begin{aligned} I_{DS}^1 &= (E_{16} - E_{13} + v(412) - v(411))/ \\ &\quad \gamma(412) - I_{So} - \alpha \cdot \\ &\quad \Delta V_{thp}/\gamma(412) - \\ &\quad \alpha^2 \cdot I_{So} \end{aligned} \tag{39}$$

Similarly, in the current control circuit 4-2''', the following equation is satisfied:

$$E_{15} = E_{14} + (1+\alpha) \cdot R(416) \cdot I(416) + V_{GS}(415) \tag{40}$$

$$V_{GS}(414) = E_{11} - E_8 \tag{41}$$

$$I_2 = I_{DS}(415) \tag{42}$$

$$I(416) = -I_{DS}(414) \tag{43}$$

From the equations (5), (19), (20), (40), (41), (42) and (43), $$\begin{aligned} I_{DS}^2 &= 1/\gamma(412) \cdot \\ &\quad [E_{14} - E_{15} + v(415) + \Delta V_{thn}) + \\ &\quad (1 + \alpha) \cdot R(416)/\gamma(414) \cdot (E_{17} - E_{14} - \\ &\quad v(415) - \Delta V_{thn})] + I_{So}/(1 + \alpha) \end{aligned} \tag{44}$$

where v (415) is the value v for the transistor 415.

If R (416)=γ (414) and $$1/(1+\alpha) \approx 1 - \alpha + \alpha^2.$$

then, the equation (36) can be replaced by $$\begin{aligned} I_{DS}^2 &= (E_{17} - E_{15} + v(415) - v(414))/\gamma(415) + \\ &\quad I_{So} + \alpha \cdot [(E_{17} - E_{14} - v(414) - \Delta V_{thn})/\gamma \\ &\quad (415) + I_{So}] + \alpha^2 \cdot I_{So} \end{aligned} \tag{45}$$

Further, if $$I_{So} = (E_{17} - E_{14} - v(414)/\gamma(415) \tag{46}$$

then, the equation (45) can be replaced by $$\begin{aligned} I_{DS}^2 &= (E_{17} - E_{15} + v(415) - v(414))/\gamma(415) + \\ &\quad I_{So} - \alpha \cdot \Delta V_{thn}/\gamma(415) + \\ &\quad \alpha^2 \cdot I_{So} \end{aligned} \tag{47}$$

Further, since the fluctuation of the output voltage $V_{OUT}$ at the output terminal OUT depends upon the fluctuation of the currents $I_{DS1}$ and $I_{DS2}$ from the equation (11), if the fluctuation of the currents $I_{DS1}$ and $I_{DS2}$ is made smaller, the fluctuation of the output voltage $V_{OUT}$ is made smaller. From the equations (39) and (47), if the values γ(412) and γ(415) are much larger than the fluctuations $\Delta V_{thn}$ and $\Delta V_{thnp}$ and the value of the current $I_{So}$ is reduced, the fluctuation of the currents, $I_{DS1}$ and $I_{DS2}$ can be suppressed. In order to increase the values γ(412) and γ(415), the ratio W/L of the transistors 412 and 415 are reduced. Also, in this case, the absolute values of the currents $I_{DS1}$ and $I_{DS2}$ per se can be reduced, and as a result, the fluctuation of the currents $I_{DS1}$ and $I_{DS2}$ due to the fluctuation of the coefficient α can be reduced. Further, the operating point P of the N-channel MOS transistors as shown in FIG. 5 and that of the P-channel MOS transistors is set in advance, so that the values of the currents $I_{DS1}$ and $I_{DS\ 2}$ at the operating point P are small, which suppresses the fluctuation of the currents $I_{DS1}$ and $I_{DS2}$.

Also, the current control circuits 4-1''' and 4-2''' of FIG. 12 can be applied to the circuits of FIGS. 6, 7, 8, 9 and 10.

Thus, in FIG. 12, the output voltage $V_{OUT}$ at the output terminal OUT is hardly affected by the fluctuation of characteristics of the N-channel and P-channel MOS transistors and the resistors $R_0, R_1, \ldots, R_{n+1}$.

Figure 13:
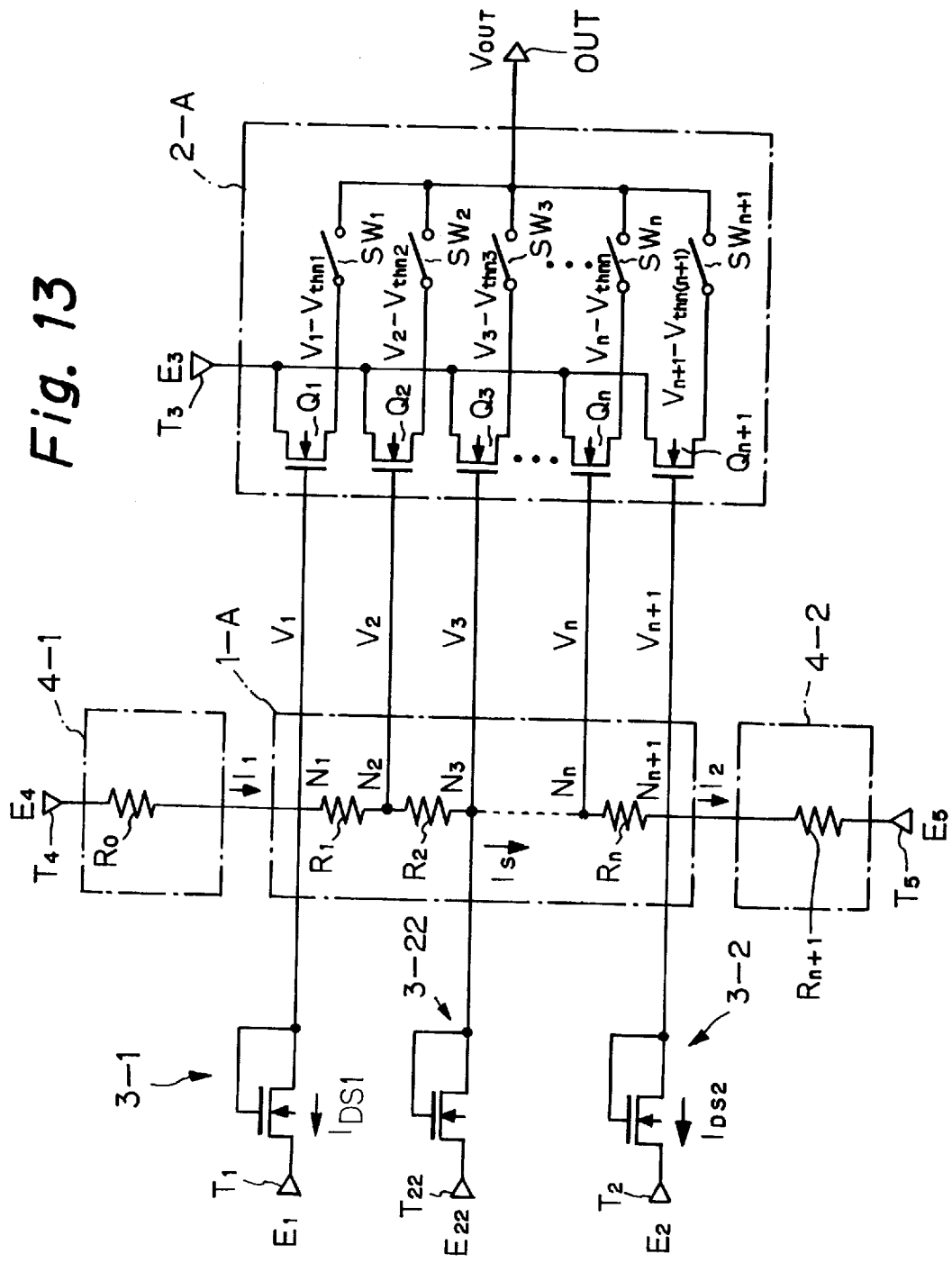
FIG. 13 is a circuit diagram illustrating a ninth embodiment of the multi-valued voltage generating circuit according to the present invention.

In FIG. 13, which illustrates a ninth embodiment of the present invention, voltage control circuits 3-22 formed by N-channel MOS transistors are connected to some of the nodes $N_2, N_3, \ldots, N_n$ of the voltage divider 1-A of FIG. 4, thus stably controlling the voltages $V_2, V_3, \ldots, V_n$ at the nodes $N_2, N_3, \ldots, N_n$. In this case, the voltage control circuits 3-22 are connected to power supply terminals such as $T_{22}$ whose voltages are $E_{22}$. Note that the voltage dividers 3-22 can be connected to at least one some of the nodes $N_2, N_3, \ldots, N_n$ of the circuits of FIGS. 7, 9 and 11.

Figure 14:
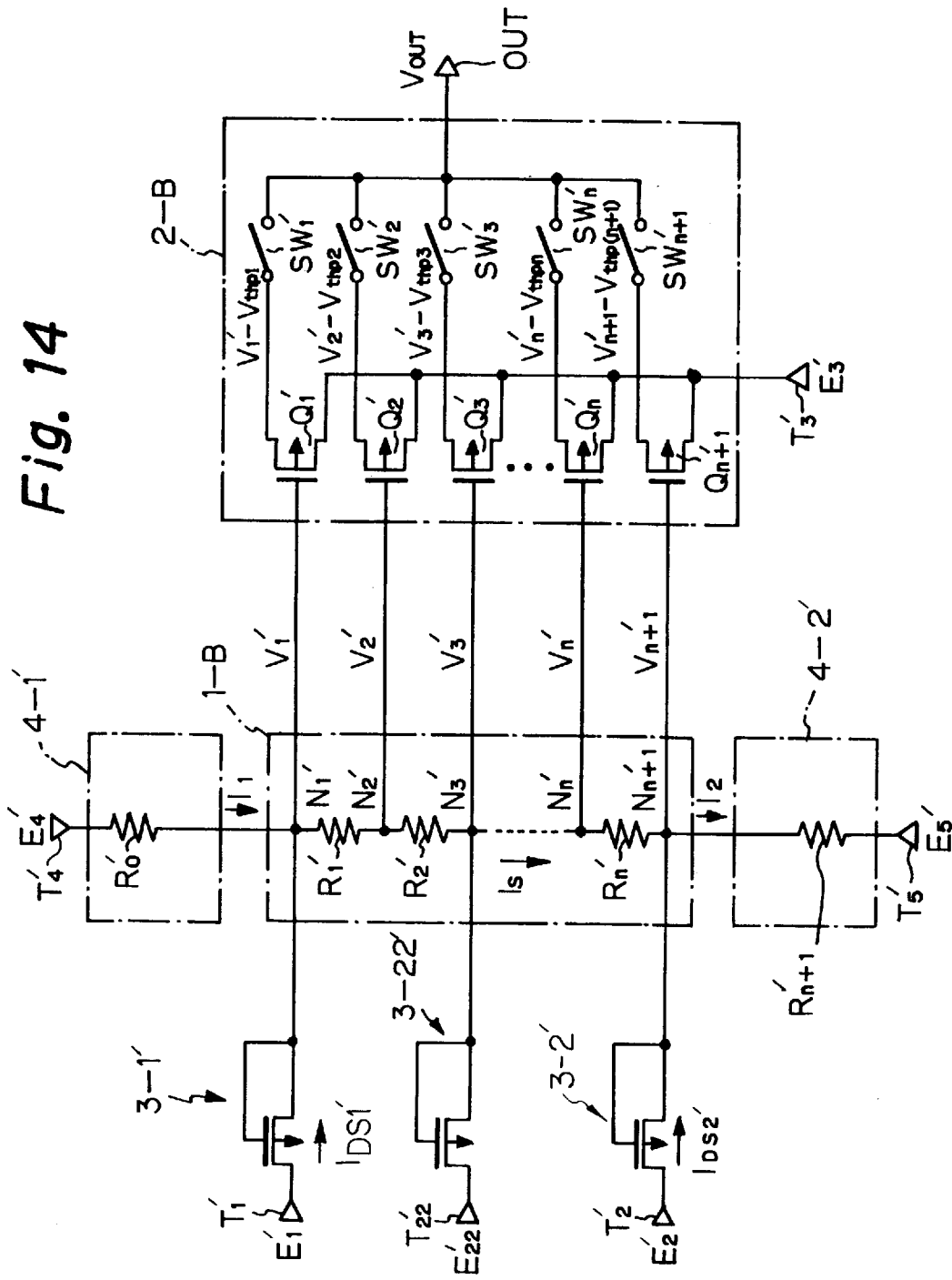
FIG. 14 is a circuit diagram illustrating a tenth embodiment of the multi-valued voltage generating circuit according to the present invention.

In FIG. 14, which illustrates a tenth embodiment of the present invention, voltage control circuits 3-22' formed by P-channel MOS transistors are connected to at least one of the nodes $N_2', N_3', \ldots, N_n'$ of the voltage divider 1-B of FIG. 6, thus stably controlling the voltages $V_2', V_3', \ldots, V_n'$ at the nodes $N_2', N_3', \ldots, N_n'$. In this case, the voltage control circuits 3-22' are connected to power supply terminals such as $T_{22}'$ whose voltages are $E_{22}'$. Note that the voltage dividers 3-22' can be connected to some of the nodes $N_2', N_3', \ldots, N_n'$ of the circuits of FIGS. 8, 10 and 12.

In FIG. 15, which illustrates an eleventh embodiment of the present invention, a voltage control circuit 5-A formed by a switch $SW_{31}$ such as a MOS switch is connected to the output terminal OUT of FIG. 4. The switch $SW_{31}$ is connected to a power supply terminal $T_{31}$ whose voltage is $E_{31}$ which satisfies:

$$E_{31} < V_{n+1} - V_{thn(n+1)}$$

That is, in FIG. 4, since the source followers $Q_1, Q_2, \ldots, Q_n, Q_{n+1}$ are formed by N-channel MOS transistors, although it is possible to pull up the output voltage $V_{out}$ at the output terminal OUT, it is impossible to pull down the output voltage $V_{out}$ at the output terminal OUT. For example, in FIG. 4, even if the switch $SW_i$ is turned OFF and thereafter, is turned ON, and then, the switch $SW_{i'}$ (i'>i) is turned ON, the output voltage $V_{OUT}$ remains at a voltage defined by the switch $SW_i$. To compensate for this, the voltage control circuit 5-A is provided in FIG. 15. In FIG. 15, before the switch $SW_{i'}$ is turned ON, the switch $SW_{31}$ is turned ON and OFF, to thereby obtain a desired voltage at the output terminal OUT.

Figure 16A:
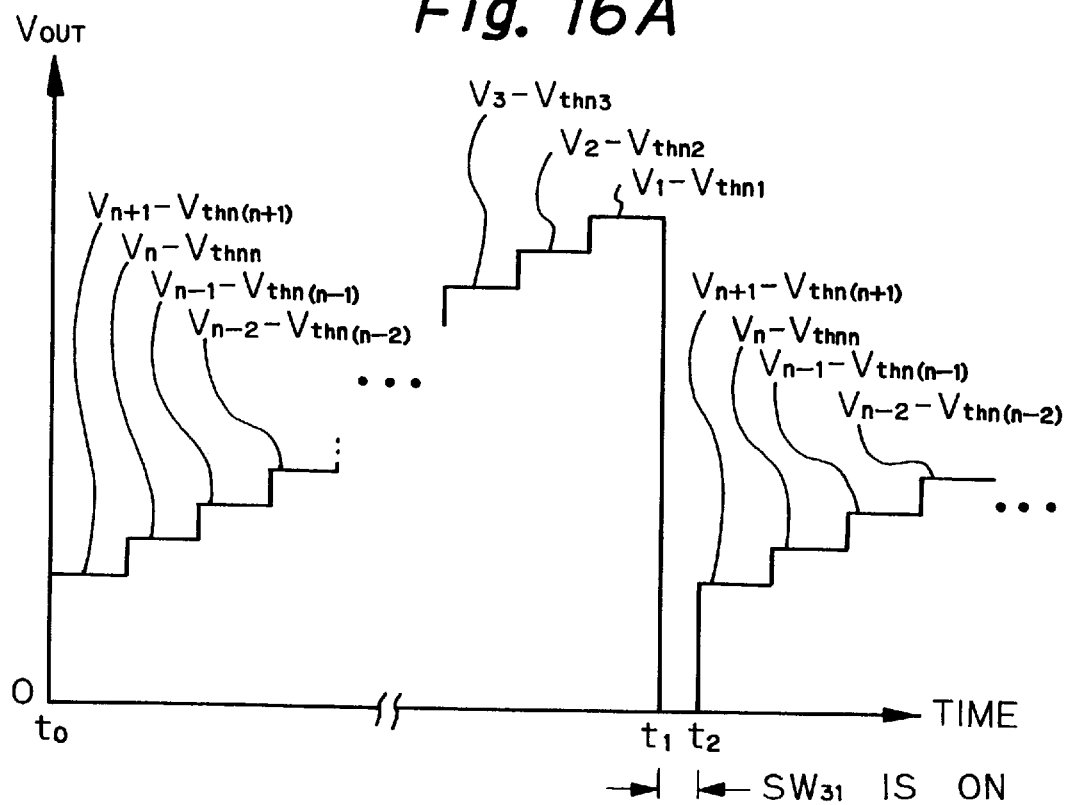
FIGS. 16A and 16B are timing diagrams showing the operation of the circuit of FIG. 15.

For example, as shown in FIG. 16A, the switches $SW_{n+1}, SW_n, \ldots, SW_1$ are sequentially turned ON, so that the output voltage $V_{out}$ is changed from $V_{n+1}-V_{thn(n+1)}$, via $V_n-V_{thnn}, \ldots, V_2-V_{thn2}$ to $V_1-V_{thn1}$. Then, the switch $SW_{31}$ is turned ON from time t1 to time t2, so that the output voltage $V_{out}$ is caused to be $E_{31}$ which is, in this case, 0V. Again, the switches $SW_{n+1}, SW_n, \ldots, SW_1$, are sequentially turned ON, so that the output voltage $V_{out}$ is changed from $V_{n+1}-V_{thn(n+1)}$, via $V_n-V_{thnn}, \ldots, V_2-V_{thn2}$ to $V_1-V_{thn1}$.

Figure 16B:
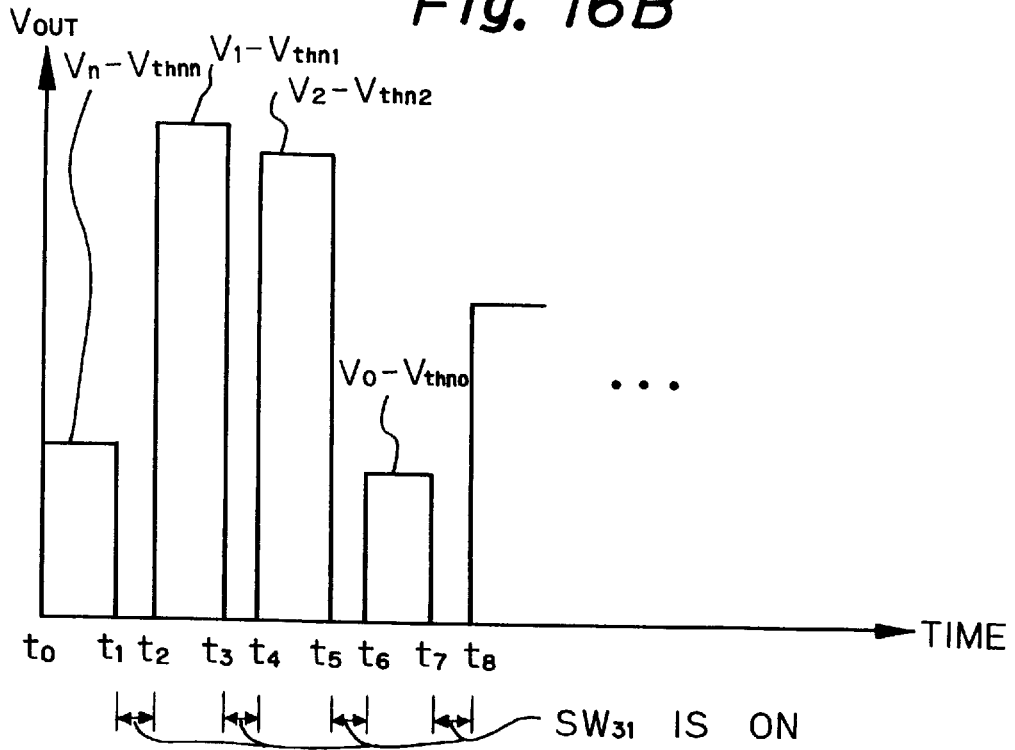

Otherwise, as shown in FIG. 16B, the switch $SW_{31}$ can be turned ON at transition time periods (t1–t2, t3–t4, t5–t6, t7–t8) from one of the switches $SW_1, SW_2, \ldots, SW_{n+1}$ to another.

Note that the voltage control circuit 5-A of FIG. 15 can be connected to the output terminal OUT of the circuits of FIGS. 7, 9 and 11.

Figure 17:
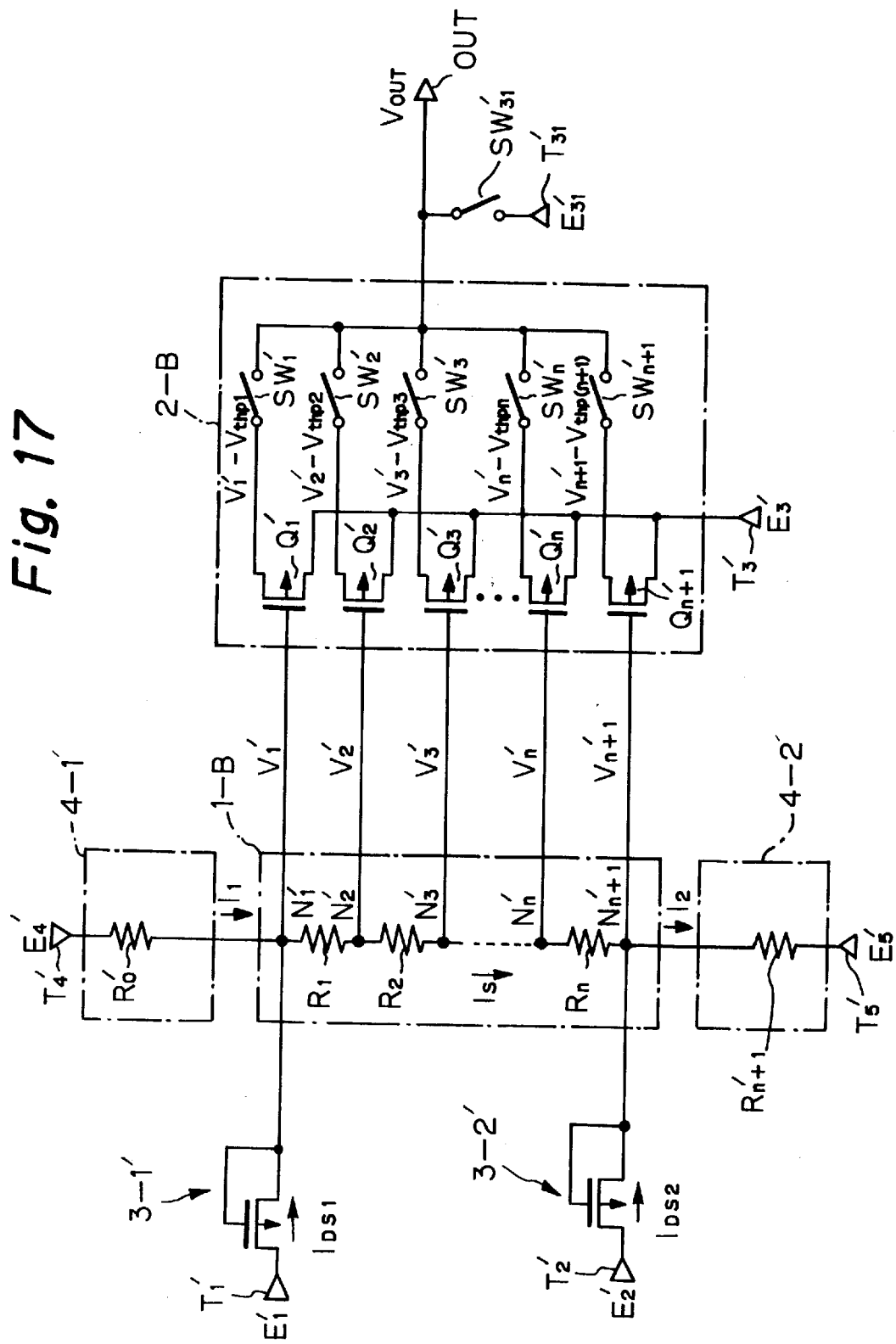
FIG. 17 is a circuit diagram illustrating an eleventh embodiment of the multi-valued voltage generating circuit according to the present invention.

In FIG. 17, which illustrates a twelfth embodiment of the present invention, a voltage control circuit 5-B formed by a switch $SW_{31}'$ such as a MOS switch is connected to the output terminal OUT of FIG. 6. The switch $SW_{31}'$ is connected to a power supply terminal $T_{31}'$ whose voltage is $E_{31}'$ which satisfies:

$$E_{31}' > V_1 = V_{thp1}$$

That is, in FIG. 6, since the source followers $Q_1', Q_2', \ldots, Q_n', Q_{n+1}'$ are formed by P-channel MOS transistors, although it is possible to pull down the output voltage $V_{OUT}$ at the output terminal OUT, it is impossible to pull up the output voltage $V_{OUT}$ at the output terminal OUT. For example, in FIG. 6, even if the switch $SW_j$ is turned OFF and thereafter, is turned ON, and then, the switch $SW_{j'}$ (j'<j) is turned ON, the output voltage $V_{OUT}$ remains at a voltage defined by the switch $SW_j$. To compensate for this, the voltage control circuit 5-B is provided in FIG. 17. In FIG. 17, before the switch $SW_{j'}$ is turned ON, the switch $SW_{31}$ is turned ON and OFF, to thereby obtain a desired voltage at the output terminal OUT.

Figure 18A:
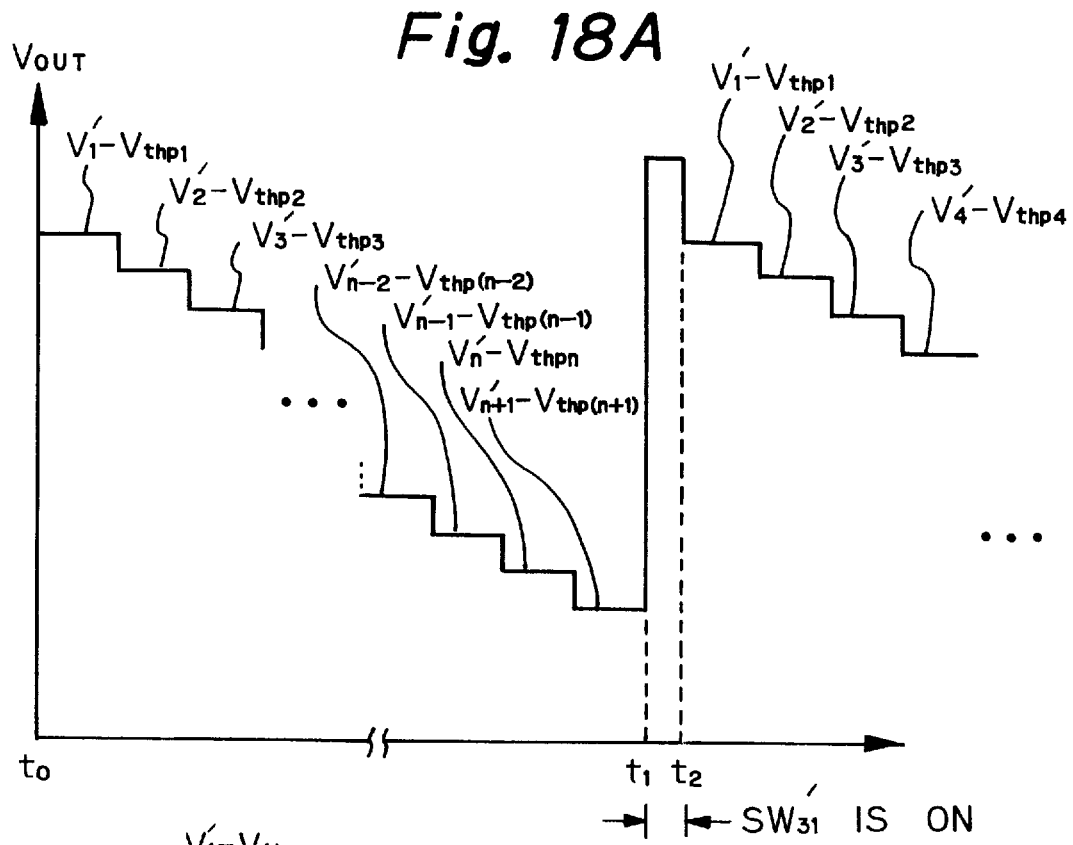
FIGS. 18A and 18B are timing diagrams showing the operation of the circuit of FIG. 17.

For example, as shown in FIG. 18A, the switches $SW_1', SW_2', \ldots, SW_{n+1}'$ are sequentially turned ON, so that the output voltage $V_{out}$ is changed from $V_1-V_{thp1}$, via $V_2'-V_{thp2}, \ldots, V_n'-V_{thpn}$ to $V_{n-1}'-V_{thp(n+1)}$. Then, the switch $SW_{31}$ is turned ON from time t1 to time t2, so that the output voltage $V_{OUT}$ is caused to be $E_{31}'$. Again, the switches $SW_1', SW_2', \ldots, SW_{n+1}'$ are sequentially turned ON, so that the output voltage $V_{OUT}$ is changed from $V_1'-V_{thp1}$, via $V_2'-V_{thp2}, \ldots, V_n'-V_{thp}$ to $V_{n+1}'-V_{thp(n+1)}$.

Figure 18B:
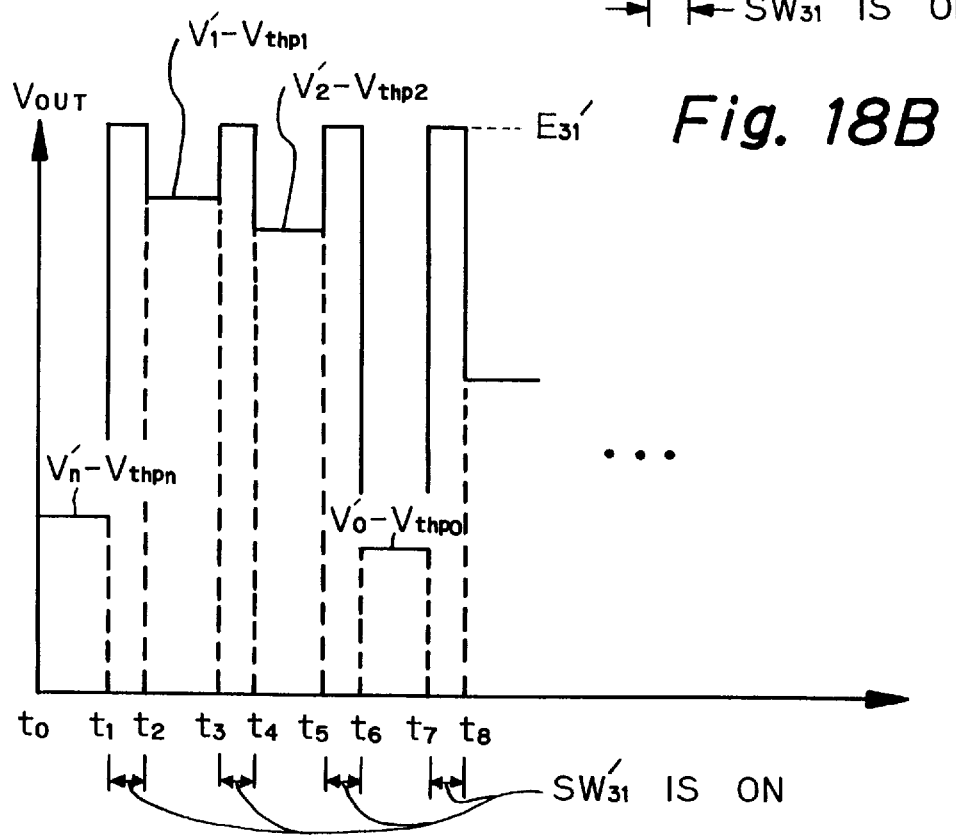

Otherwise, as shown in FIG. 18B, the switch $SW_{31}$ can be turned ON at transition time periods (t1–t2, t3–t4, t5–t6, t7–t8) from one of the switches $SW_1', SW_2', \ldots, SW_{n+1}'$ to another.

Note that the voltage control circuit 5-B of FIG. 17 can be connected to the output terminal OUT of the circuits of FIGS. 8, 10 and 12.

Figure 19B:
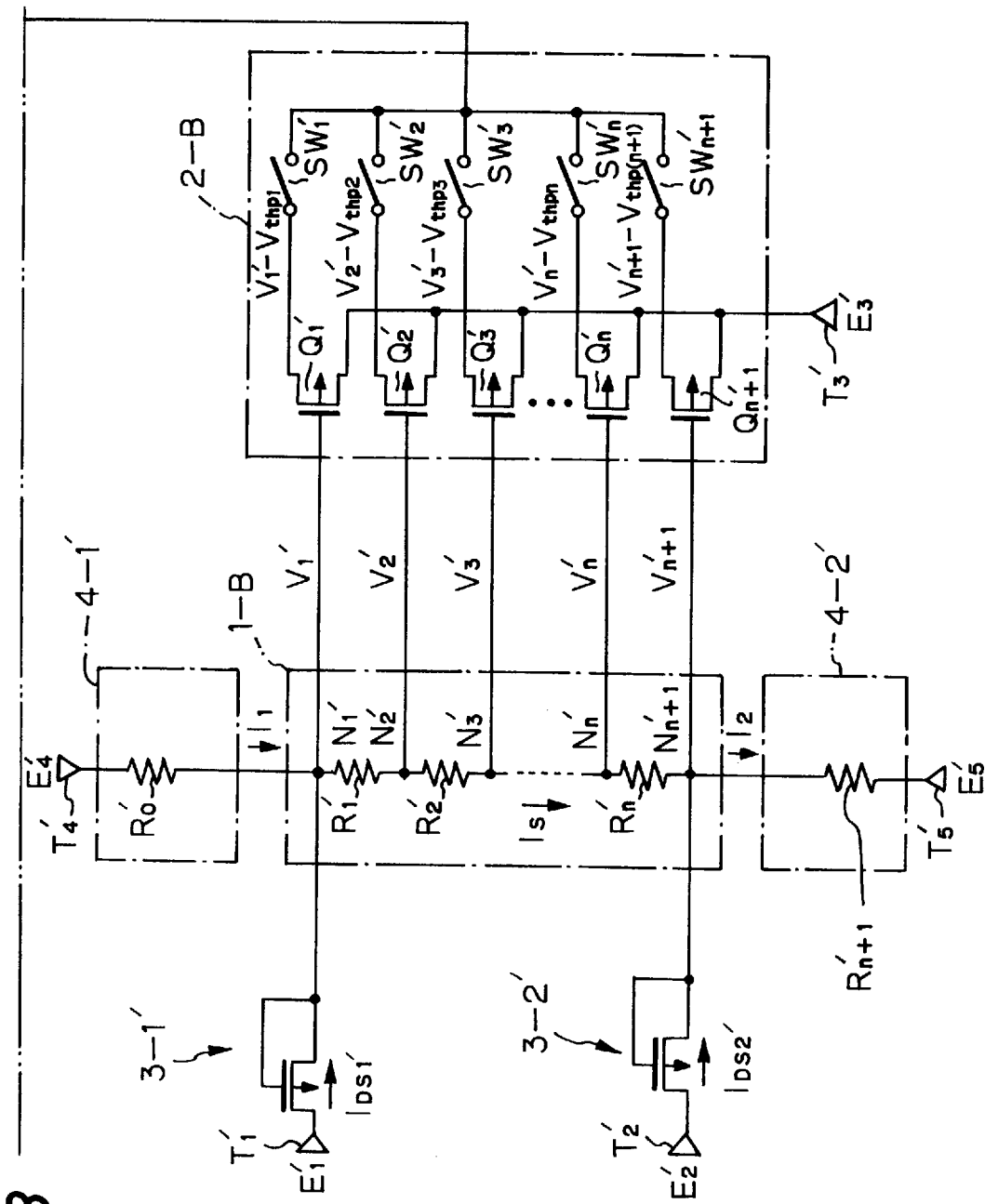

In FIGS. 19A and 19B, which illustrate a thirteenth embodiment of the present invention, the circuit of FIG. 4 and the circuit of FIG. 6 are combined by one output terminal OUT. In this case, the output circuit 2-A has only a pulling-up function for the output voltage $V_{OUT}$, and the output circuit 2-B has only a pulling-down function for the output voltage $V_{OUT}$. Therefore, when one of the switches $SW_1, SW_2, \ldots, SW_{n+1}$ and one of the switches $SW_1', SW_2', \ldots, SW_{n+1}'$ are alternately turned ON, the output voltage $V_{OUT}$ can be caused to be a desired voltage without the voltage control circuit 5-A or 5-B of FIG. 15 or 17.

In FIGS. 19A and 19B, note that one of the circuits of FIGS. 4, 7, 9 and 11 and one of the circuits of FIGS. 6, 8, 10 and 12 can be combined with each other.

Figure 20:
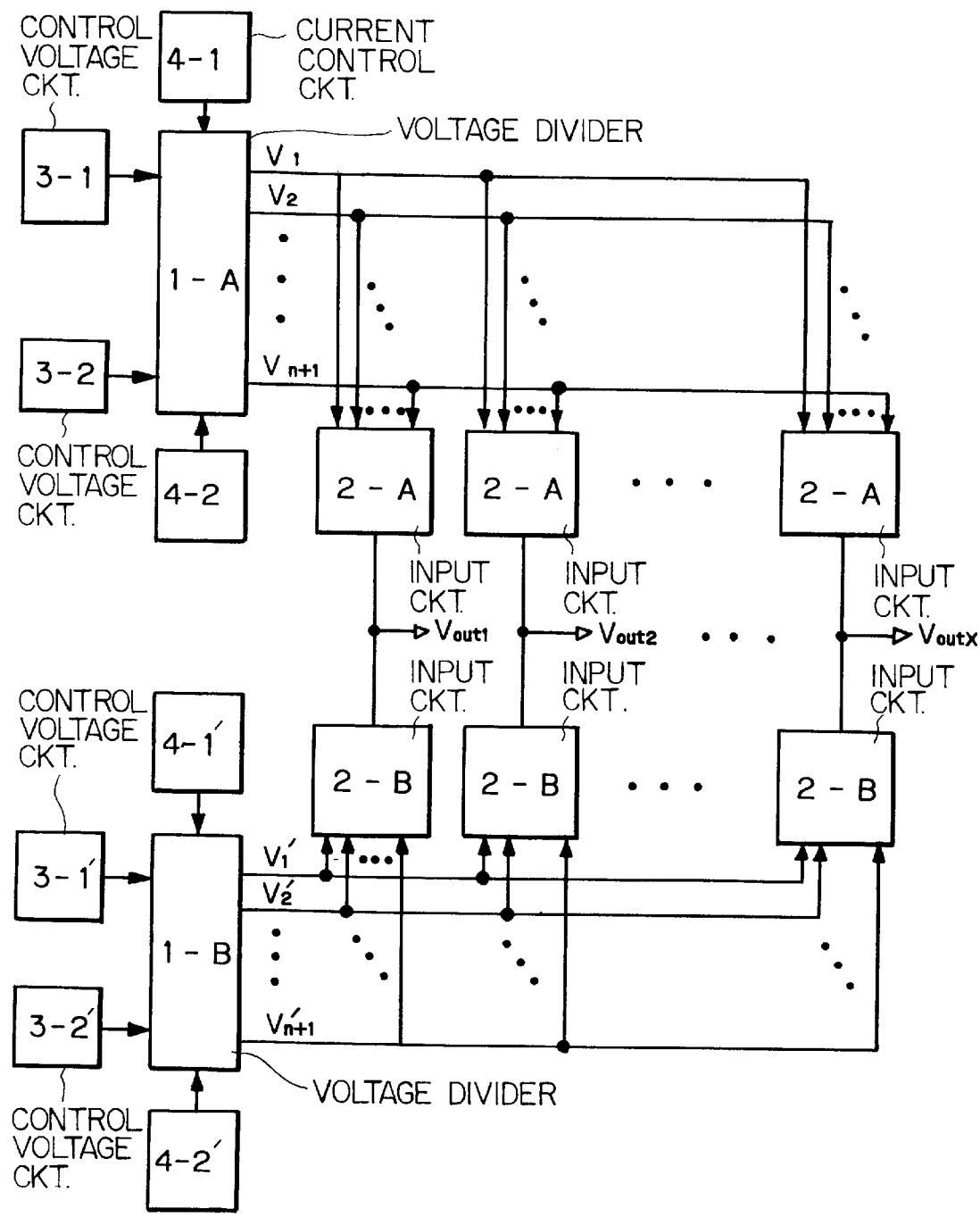
FIG. 20 is a circuit diagram illustrating a fourteenth embodiment of the multi-valued voltage generating circuit according to the present invention.

In FIG. 20, which illustrates a fourteenth embodiment of the present invention, a plurality of output circuits 2-A and a plurality of output circuits 2-B as illustrated in FIGS. 19A and 19B are provided, which can have a plurality of output voltages $V_{OUT1}, V_{OUT2}, \ldots, V_{OUTX}$.

Note that the circuits 4-1, 4-2, 4-1' and 4-2' can be replaced by the circuits 4-1" and 4-2" of FIG. 11 or the circuits 4-1''' and 4-2''' of FIG. 12.

The simulation results of the embodiments will be explained next with reference to FIGS. 21, 22, 23, 24 and 25. In this case, in order to simplify the description, the source voltage of all the transistors are equal to the substrate voltages thereof, and the threshold voltages $V_{thni}$ and $V_{thpj}$ are definite.

Figure 21:
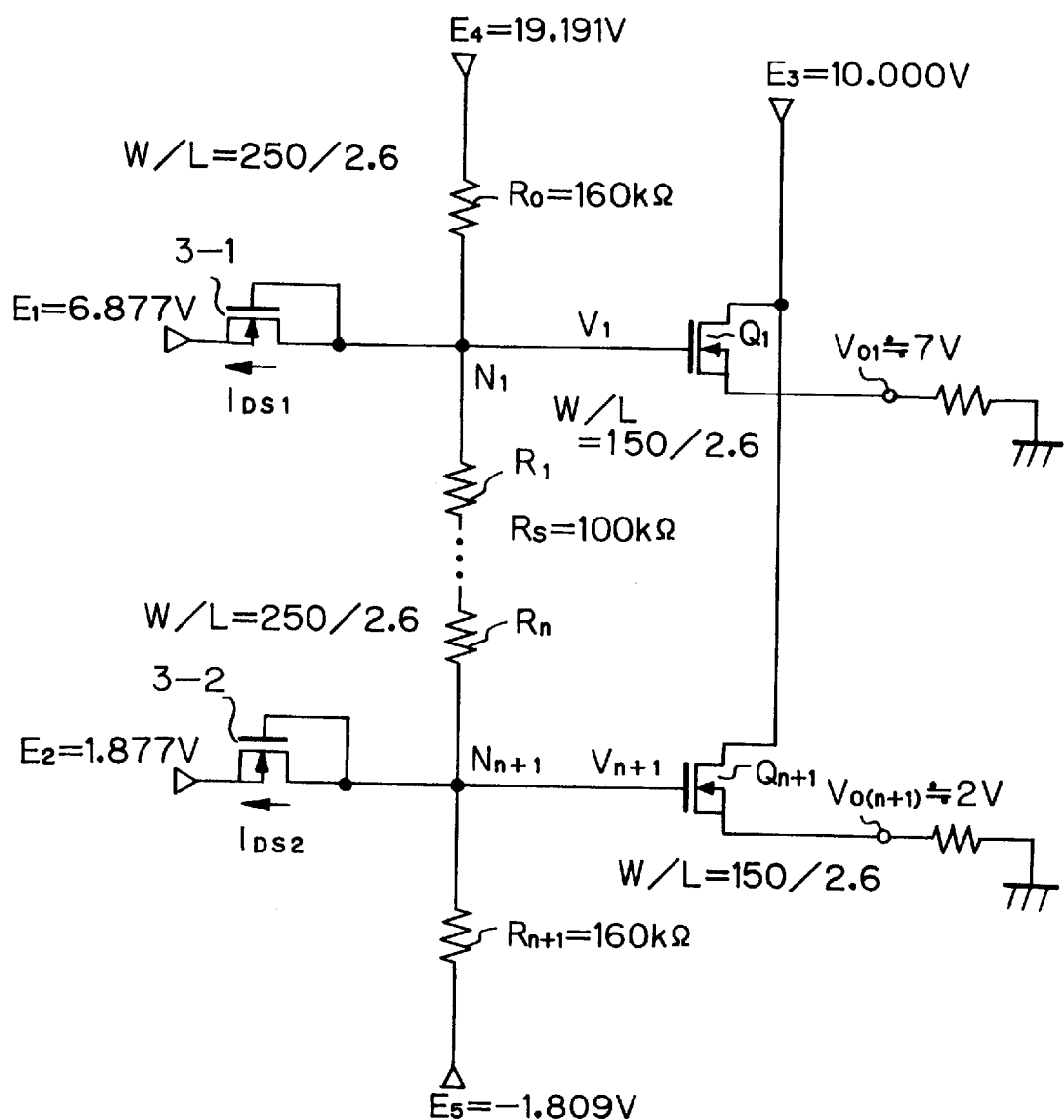
FIG. 21 is a circuit diagram for explaining the simulation of the circuit of FIG. 4.

In FIG. 21, which is a circuit diagram of the circuit of FIG. 4, for generating the output voltage $V_{OUT}$ having 2 to 7V the following conditions are set:

$V_{thn}=1$ V $\Delta V_{thn}=\pm 0.1$ V (maximum)

$\alpha=\pm 0.1$ (maximum)

Also, the operating parameters of the transistors 3-1 and 3-2 at the operating point P under the condition that $\Delta V_{thn}=0$ and $\alpha=0$ are set (see FIG. 5) as follows;

$I_{DS1}=I_{DS2}=20$ μA $\gamma_1=\gamma_2=3.2$ kΩ

$v_1=v_2=1.05$V

Further, $R_O=R_{n+1}=160$ kΩ

$R_S(=R_1+R_2+\ldots+R_n)=100$ kΩ

If $\Delta V_{thn}=0$, $\alpha=0$, $V_{O1}=7$V and $V_{O(n+1)}=2$V, from the equations (8), (9) and (11), $E_1=6.886$ V $E_2=1.886$ V Also, if $\Delta V_{thn}=0$ and $\alpha=0$, from the equations (19), (22) and (25), $E_4=19.2$ V $E_5=-1.8$ V If the values $\Delta V_{thn}$ and $\alpha$ are not zero due to the characteristic fluctuations, from the equations (22) and (25), $$I_{DS}^1 = I_{DS}^2$$
$$= (1.02 + \alpha)^{-1} \cdot$$
$$(20.4 \mu A - \Delta V_{thn}/160 \, k\Omega$$

In this case, if $\Delta V_{thn}=\pm 0.1$ V, $\Delta V_{thn}/160$ kΩ (=±0.625 μA) is much smaller than 20.4 μA, then $I_{DS1}=I_{DS2}=18.2$ μA (α=0.1)

$I_{DS2}=I_{DS2}=22.2$ μA ($\alpha=-0.1$)

Thus, the fluctuations of the currents $I_{DS1}$ and $I_{DS2}$ can be small so that the fluctuation of the output voltage $V_{OUT}$ can be small.

In view of the foregoing, the voltages $E_1$, $E_2$, $E_3$, $E_4$ and $E_5$ are set for the simulation as follows:

$E_1=6.877$ V
$E_2=1.877$ V
$E_3=10.000$ V
$E_4=19.191$ V
$E_5=-1.809$ V

Also, the parameters of the N-channel MOS transistors 3-1, 3-2, $Q_1, \ldots Q_{n+1}$ are set as indicated in FIG. 21.

The simulation results are as follows:

① for $\Delta V_{thn}=0.1$ V and $\alpha=0.1$,
$V_{O1}=6.9931$ V
$V_{O(n+1)}=1.9945$ V
② for $\Delta V_{thn}=0.1$ V and $\alpha=-0.1$,
$V_{O1}=7.0054$ V
$V_{O(n+1)}=2.0068$ V
③ for $\Delta V_{thn}=-0.1$ V and $\alpha=0.1$,
$V_{O1}=6.9935$ V
$V_{O(n+1)}=1.9945$ V
④ for $\Delta V_{thn}=-0.1$ V and $\alpha=-0.1$,
$V_{O1}=7.0058$ V
$V_{O(n+1)}=2.0072$ V Thus, an accuracy of ±7 mv can be obtained in FIG. 21, and therefore, the circuit of FIG. 4 can generate a stable output voltage regardless of the fluctuations of characteristics.

Figure 22:
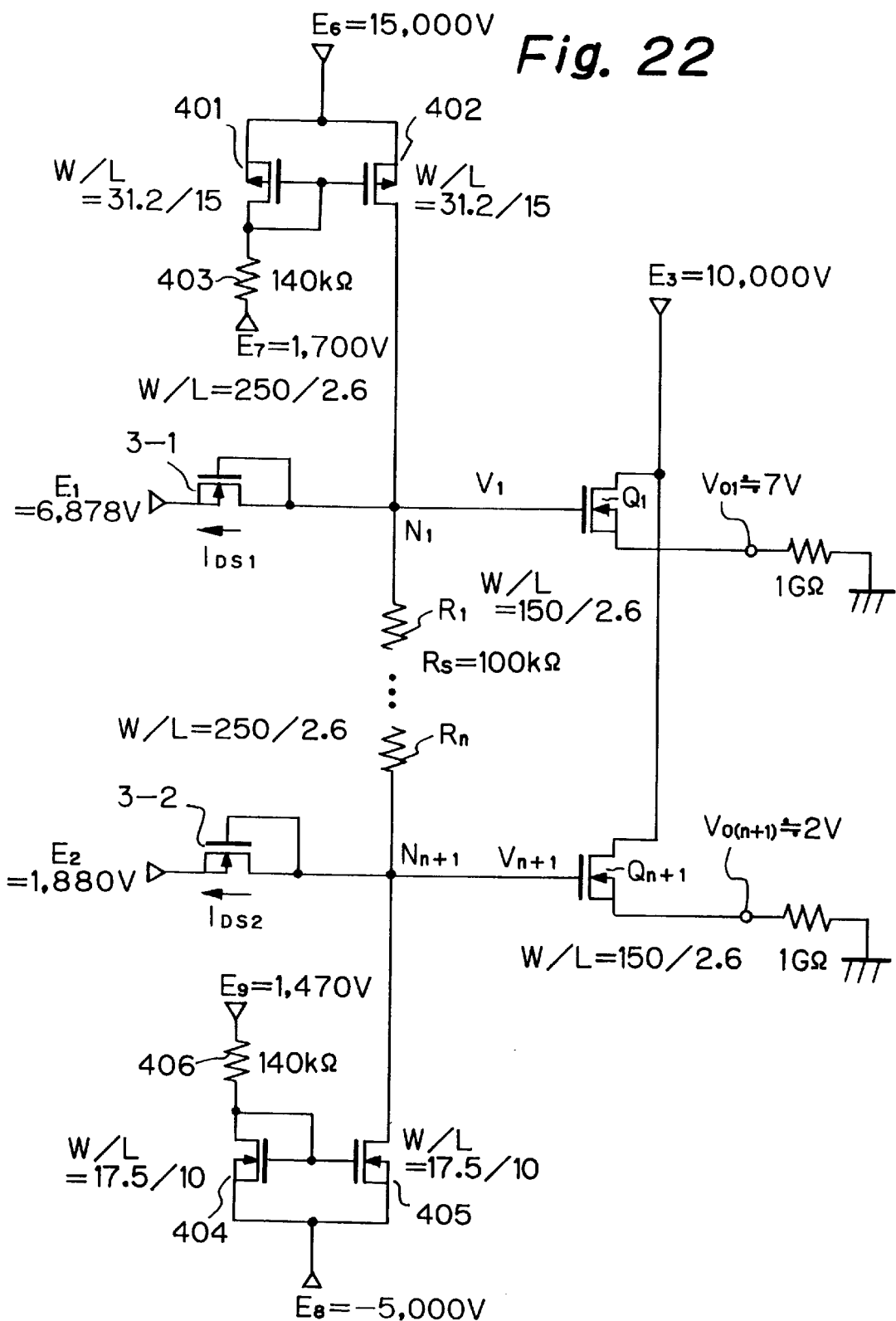
FIG. 22 is a circuit diagram for explaining the simulation of the circuit of FIG. 11.

In FIG. 22, which is a simulation circuit diagram of the circuit of FIG. 11 for generating the output voltage $V_{OUT}$ having 2 to 7V, the following conditions are set:

$V_{thn}=1$ V
$V_{thp}=-1$ V
$\Delta V_{thn}=\pm 0.1$ V (maximum)
$\Delta V_{thp}=\pm 0.1$ V (maximum)
$\alpha=\pm 0.1$ (maximum)

Also, the operating parameters of the transistors 3-1 and 3-2 at the operating point P under the condition that $\Delta V_{thn}=0$ and $\alpha=0$, are set (see FIG. 5) as follows;

$I_{DS1}=I_{DS2}=20$ μA
$\gamma_1=\gamma_2=3.2$ kΩ
$v_1=v_2=1.05$ V

Further,
$R_{403}=R_{406}=140$ kΩ
$R_S(=R_1+R_2+\ldots+R_n)=100$ kΩ

Figure 23:
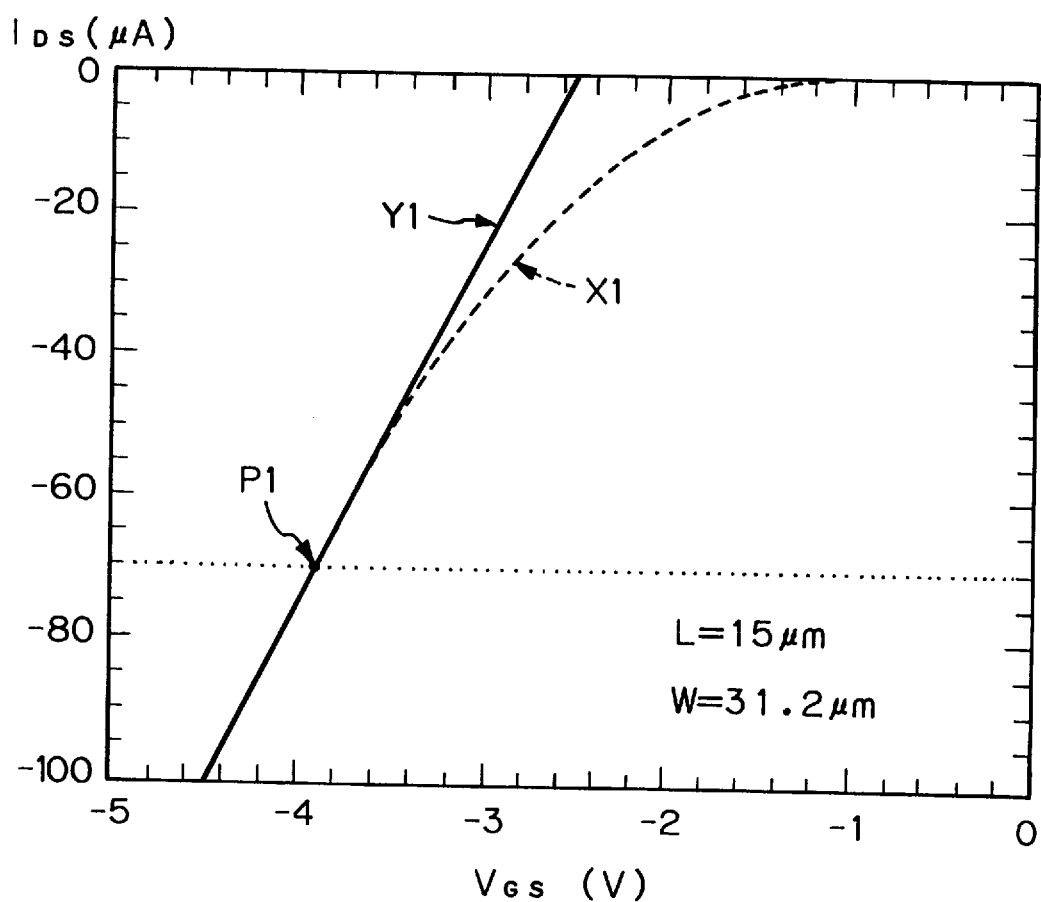
FIG. 23 is a graph showing the operation of the P-channel MOS transistors 401 and 402 of FIG. 22.

Also, if the P-channel MOS transistors 401 and 402 have a characteristic curve X1 as shown in FIG. 23, the operating parameters of the P-channel MOS transistors 401 and 402 are approximated to a characteristic line Y1 at an operating point P1 as shown in FIG. 23. In this case, $I_{DS}(401)=I_{DS}(402)=-70$ μA
$\gamma_{401}=20$ kΩ
$v_{401}=-2.5$ V.

Figure 24:
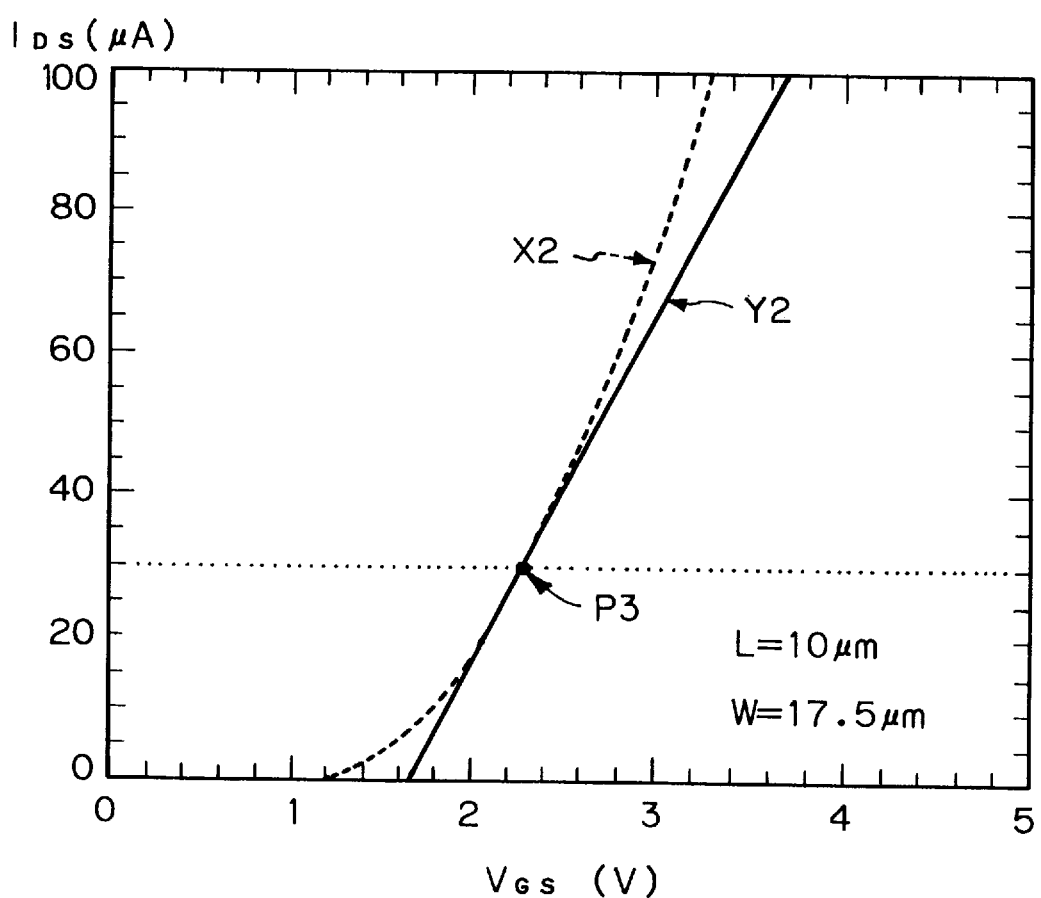
FIG. 24 is a graph showing the operation of the N-channel MOS transistors 404 and 405 of FIG. 22.

Further, if the N-channel MOS transistors 404 and 405 have a characteristic curve X2 as shown in FIG. 24, the operating parameters of the N-channel MOS transistors 404 and 405 are approximated to a characteristic line Y2 at an operating point P2 as shown in FIG. 24. In this case, $I_{DS}(404)=I_{DS}(405)=30$ μA $\gamma_{404}=20$ kΩ
$v_{404}=1.67$ V.

If $\Delta V_{thn}=0$, $\Delta V_{thp}=0$, $\alpha=0$, $V_{O1}=7$ V and $V_{O(n+1)}=2$V, from the equations (8), (9) and (11), $E_1=6.886$ V
$E_2=1.886$ V Similarly, if $\Delta V_{thn}=0$, $\Delta V_{thp}=0$ and $\alpha=0$, from the equations (19), (28) and (31), the voltages $E_6$, $E_7$, $E_8$ and $E_9$ are set by $E_6-E_7=13.7$ V
$E_9-E_8=6.47$ V where $E_6$ and $E_8$ can be arbitrarily determined under a condition that the transistors 402 and 405 are operated in a saturated region.

If the values $\Delta V_{thn}$, $\Delta V_{thp}$ and $\alpha$ are not zero due to the characteristic fluctuations, from the equations (28) and (31), $I_{DS1}=(11.2V+\Delta V_{thp})/[(1+\alpha)\cdot(140\ \text{k}\Omega+20\ \text{k}\Omega)]-50\ \mu\text{A}/(1+\alpha)$ $I_{DS2}=(-4.8V+\Delta V_{thn})/[(1+\alpha)\cdot(140\ \text{k}\Omega+20\ \text{k}\Omega)]+50\ \mu\text{A}/(1+\alpha)$ In this case, since $\Delta V_{thp}\ll 11.2V$ and $\Delta V_{thn}\ll 4.8V$, the terms $\Delta V_{thp}$ and $\Delta V_{thn}$ can be neglible. Therefore, $I_{DS1}=18.9$ μA and $I_{DS2}=17.9$ μA ($\alpha=0.1$)
$I_{DS2}=21.1$ μA and $I_{DS2}=22.7$ μA ($\alpha=-0.1$)

Thus, the fluctuations of the currents $I_{DS1}$ and $I_{DS2}$ can be small, the fluctuation of the output voltage $V_{OUT}$ can be small.

In view of the foregoing, the voltages $E_1$, $E_2$, $E_3$, $E_6$, $E_7$, $E_8$ and $E_9$ are set for the simulation as follows:

$E_1=6.878$ V
$E_2=1.880$ V
$E_3=10.000$ V
$E_6=15.000$ V
$E_7=1.700$ V
$E_8=-5.000$ V
$E_9=-1.470$ V

Also, the parameters of the transistors and the resistors are set as indicated in FIG. 22.

The simulation results are as follows:

① for $\Delta V_{thn}=0.1$ V, $\Delta V_{thp}=-0.1$ V and $\alpha=0.1$,
$V_{O1}=6.9963$ V
$V_{O(n+1)}=1.9974$ V
② for $\Delta V_{thn}=0.1$ V, $\Delta V_{thp}=-0.1$ V and $\alpha=-0.1$,
$V_{O1}=7.0022$ V
$V_{O(n+1)}=2.0124$ V
③ for $\Delta V_{thn}=-0.1$ V, $\Delta V_{thp}=-0.1$ V and $\alpha=0.1$,
$V_{O1}=6.9930$ V
$V_{O(n+1)}=1.9893$ V
④ for $\Delta V_{thn}=-0.1$ V, $\Delta V_{thp}=-0.1$ V and $\alpha=-0.1$,
$V_{O1}=6.9986$ V
$V_{O(n+1)}=2.0035$ V
⑤ for $\Delta V_{thn}=0.1$ V, $\Delta V_{thp}=0.1$ V and $\alpha=0.1$,
$V_{O1}=7.0033$ V
$V_{O(n+1)}=1.9976$ V
⑥ for $\Delta V_{thn}=0.1$ V, $\Delta V_{thp}=0.1$ V and $\alpha=-0.1$,
$V_{O1}=7.0103$ V
$V_{O(n+1)}=2.0127$ V
⑦ for $\Delta V_{thn}=-0.1$ V, $\Delta V_{thp}=0.1$ V and $\alpha=0.1$,
$V_{O1}=6.9998$ V
$V_{O(n+1)}=1.9895$ V ⑧ for $\Delta V_{thn}=-0.1$ V, $\Delta V_{thp}=0.1$ V and $\alpha=-0.1$, $V_{O1}=7.0066$ V $V_{O(n+1)}=2.0038$ V Thus, an accuracy of ±13 mv can be obtained in FIG. 22, and therefore, the circuit of FIG. 11 can generate a stable output voltage regardless of the fluctuations of characteristics.

Figure 25:
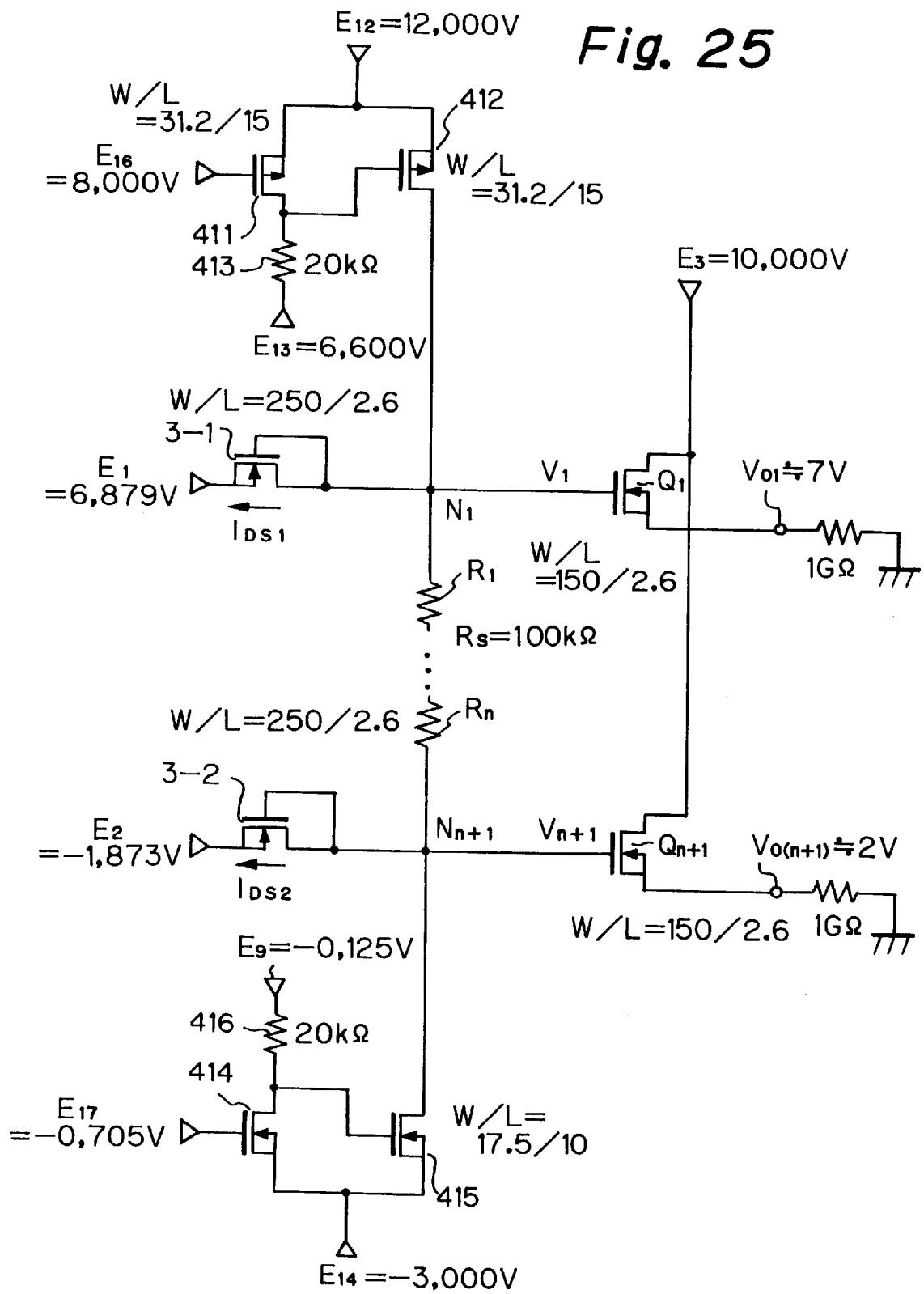
FIG. 25 is a circuit diagram for explaining the simulation of the circuit of FIG. 12.

In FIG. 25, which is a simulation circuit diagram of the circuit of FIG. 12 for generating the output voltage $V_{OUT}$ having 2 to 7V, the following conditions are set:

$V_{thni}=1$ V $V_{thpj}=-1$ V $\Delta V_{thn}=\pm 0.1$ V (maximum)

$\Delta V_{thp}=\pm 0.1$ V (maximum)

$\alpha=\pm 0.1$ (maximum)

Also, the operating parameters of the transistors 3-1 and 3-2 at the operating point P under the condition that $\Delta V_{thn}=0$ and $\alpha=0$ are set (see FIG. 5) as follows;

$I_{DS1}=I_{DS2}=20$ μA $\gamma_1=\gamma_2=3.2$ kΩ

$v_1=v_2=1.05$ V

Further, $R_S(=R_1+R_2+\ldots +R_n)=100$ kΩ

Also, if the P-channel MOS transistors 411 and 412 have a characteristic curve X1 as shown in FIG. 23, the operating parameters of the P-channel MOS transistors 411 and 412 are approximated to a characteristic line Y1 at an operating point P1 as shown in FIG. 23. In this case, $I_{DS}(411)=I_{DS}(412)=-70$ μA $\gamma_{411}=\gamma_{412}=R_{413}=20$ kΩ

$v_{411}=v_{412}=-2.5$ V.

Further, if the N-channel MOS transistors 414 and 415 have a characteristic curve X2 as shown in FIG. 24, the operating parameters of the N-channel MOS transistors 414 and 415 are approximated to a characteristic line Y2 at an operating point P2 as shown in FIG. 24. In this case, $I_{DS}(414)=I_{DS}(415)=30$ μA $\gamma_{414}=\gamma_{415}=R_{416}=20$ kΩ

$v_{414}=v_{415}=1.67$ V.

If $\Delta V_{thn}=0$, $\Delta V_{thp}=0$, $\alpha=0$, $V_{O1}=7$V and $V_{O(n+1)}=2$V, from the equations (8), (9) and (11), $E_1=6.886$ V $E_2=1.886$ V Similarly, if $\Delta V_{thn}=0$, $\Delta V_{thp}=0$ and $\alpha=0$, from the equations (19), (38), (39), (46) and (47), the voltages $E_{12}$, $E_{13}$, $E_{14}$, $E_{15}$, $E_{16}$ and $E_{17}$ are set by $E_{12}-E_{16}=3.5$ V $E_{16}-E_{13}=1.4$ V $E_{17}-E_{14}=2.67$ V $E_{15}-E_{17}=0.60$ V where $E_{12}$ and $E_{14}$ can be arbitrarily determined under a condition that the transistors 412 and 415 are operated in a saturated region.

If the values $\Delta V_{thn}$, $\Delta V_{thp}$ and $\alpha$ are not zero due to the characteristic fluctuations, from the equations (39) and (47), $I_{DS1}=20$ μA$-\alpha\cdot \Delta V_{thp}/20$ kΩ$-\alpha^2\cdot 50$ μA $I_{DS2}=20$ μA$-\alpha\cdot \Delta V_{thn}/20$ kΩ$-\alpha^2\cdot 50$ μA In this case, the terms $\alpha\cdot \Delta V_{thp}/20$ kΩ, $\alpha\cdot \Delta V_{thn}/20$ kΩ and $\pm\alpha^2\cdot 50$ μA are smaller than ±1 μA when $\Delta V_{thn}=\pm 0.1$V, $\Delta V_{thp}=\pm 1$V and $\alpha=\pm 0.1$. Thus the fluctuation of, the currents $I_{DS1}$ and $I_{DS2}$ can be small. the fluctuation of the output voltage $V_{OUT}$ can be small.

In view of the foregoing, the voltages $E_1$, $E_2$, $E_3$, $E_{12}$, $E_{13}$, $E_{14}$, $E_{15}$, $E_{16}$, $E_{17}$ are set for the simulation as follows:

$E_1=6.879$ V $E_2=1.873$ V $E_3=10.000$ V $E_{12}=12.000$ V $E_{13}=6.600$ V $E_{16}=8.000$ V $E_{14}=-3.000$ V $E_{15}=-0.125$ V $E_{17}=-0.705$ V

Also, the parameters of the transistors and the resistors are set as indicated in FIG. 25.

The simulation results are as follows:

① for $\Delta V_{thn}=0.1$ V, $\Delta V_{thp}=-0.1$ V and $\alpha=0.1$, $V_{O1}=6.9963$ V $V_{O(n+1)}=1.9929$ V ② for $\Delta V_{thn}=0.1$ V, $\Delta V_{thp}=-0.1$ V and $\alpha=-0.1$, $V_{O1}=6.9974$ V $V_{O(n+1)}=2.0091$ V ③ for $\Delta V_{thn}=-0.1$ V, $\Delta V_{thp}=0.1$ V and $\alpha=0.1$, $V_{O1}=6.9930$ V $V_{O(n+1)}=1.9919$ V ④ for $\Delta V_{thn}=-0.1$ V, $\Delta V_{thp}=-0.1$ V and $\alpha=-0.1$, $V_{O1}=6.9941$ V $V_{O(n+1)}=2.0006$ V ⑤ for $\Delta V_{thn}=0.1$ V, $\Delta V_{thp}=0.1$ V and $\alpha=0.1$, $V_{O1}=6.9988$ V $V_{O(n+1)}=1.9930$ V ⑥ for $\Delta V_{thn}=0.1$ V, $\Delta V_{thp}=0.1$ V and $\alpha=-0.1$, $V_{O1}=7.0098$ V $V_{O(n+1)}=2.0095$ V ⑦ for $\Delta V_{thn}=-0.1$ V, $\Delta V_{thp}=0.1$ V and $\alpha=0.1$, $V_{O1}=6.9957$ V $V_{O(n+1)}=1.9920$ V ⑧ for $\Delta V_{thn}=-0.1$ V, $\Delta V_{thp}=0.1$ V and $\alpha=-0.1$, $V_{O1}=7.0063$ V $V_{O(n+1)}=2.0010$V Thus, an accuracy of ±10 mv can be obtained in FIG. 25, and therefore, the circuit of FIG. 12 can generate a stable output voltage regardless of the fluctuations of characteristics.

As explained hereinabove, according to the present invention, a stable output voltage can be obtained at the output terminal of a multi-valued voltage generating circuit regardless of the fluctuation of the manufacturing process.

We claim:

1. A multi-valued voltage generating circuit comprising:

a voltage divider connected between first and second nodes and formed by a series of resistors;

an output circuit, connected to said first and second nodes and nodes of said resistors, for selecting one of voltages at said first and second nodes and said nodes of said resistors and generating said one selected voltage at an output terminal;

first and second control voltage circuits, each connected to one of said first and second nodes, for controlling voltages at said first and second nodes to compensate for fluctuations of said selected voltage at said output terminal by a fluctuation of said output circuit; and first and second current control circuits, each connected to one of said first and second nodes, for controlling currents flowing through said series of resistors to control a difference in potential between said first and second nodes at a certain value.

2. The circuit as set forth in claim 1, further comprising a switch, connected to said output terminal and a power supply terminal, for forcibly pulling a voltage at said output terminal to a power supply voltage.

3. The circuit as set forth in claim 1, wherein said output circuit comprises:
   a plurality of first switches each connected to said first and second nodes and said nodes of said resistors;
   a source follower type transistor having a gate connected to said first switches and a source connected to said output terminal; and
   a power supply terminal connected to a drain of said source follower type MOS transistor.

4. The circuit as set forth in claim 3, wherein said output circuit further comprises a second switch, connected between the gate of said source follower type transistor and a power supply terminal, for turning OFF said source follower type transistor.

5. The circuit as set forth in claim 3, wherein each of said first and second voltage control circuits comprises a transistor which is the same type as said source follower type transistor and has a source connected to a power supply terminal, a gate and a drain both connected to one of said first and second nodes.

6. The circuit as set forth in claim 1, wherein said output circuit comprises:
   a plurality of source follower type transistors having gates each connected to one of said first and second nodes and said nodes of said resistors;
   a plurality of switches each connected between one of sources of said source follower type MOS transistors and said output terminal.

7. The circuit as set forth in claim 6, wherein each of said first and second voltage control circuits comprises a transistor which is the same type as said source follower type transistors and has a source connected to a power supply terminal, a gate and a drain both connected to one of said first and second nodes.

8. The circuit as set forth in claim 1, further comprising at least one additional voltage control circuit connected to an arbitrary node of said resistors, said additional voltage control circuit having a similar configuration to said first and second voltage control circuits.

9. The circuit as set forth in claim 1, wherein each of said first and second current control circuits comprises a resistor connected to a power supply terminal.

10. The circuit as set forth in claim 1, wherein each of said first and second current control circuits comprises:
    a current mirror circuit, connected to one of said first and second nodes, for supplying a current to said one of said first and second nodes; and
    an additional resistor, connected to said current mirror circuit, for sensing fluctuations of said series of resistors to define said current.

11. The circuit as set forth in claim 1, wherein each of said first and second current control circuits comprises:
    a first transistor having a source connected to a first power supply terminal, a gate and drain both connected to the gate of said first transistor;
    a second transistor having a source connected to said first power supply terminal, a gate connected to the gate of said first transistor, and a drain connected to one of said first and second nodes; and
    an additional resistor, connected between the drain of said first transistor and a second power supply terminal, for sensing fluctuations of said series of resistors.

12. The circuit as set forth in claim 1, wherein each of said first and second current control circuits comprises:
    a first transistor having a source connected to a first power supply terminal, a gate connected to a second power supply terminal and a drain;
    a second transistor having a source connected to said first power supply terminal, a gate connected to the drain of said first transistor, and a drain connected to one of said first and second nodes; and
    an additional resistor, connected between the drain of said first transistor and a third power supply terminal, for sensing fluctuations of said series of resistors.

13. A multi-valued voltage generating circuit comprising:
    a first voltage divider connected between first and second nodes and formed by a series of first resistors;
    at least one first output circuit, connected to said first and second nodes and nodes of said first resistors, for selecting one of first voltages at said first and second nodes and said nodes of said first resistors and generating said selected first voltage at an output terminal;
    first and second control voltage circuits, each connected to one of said first and second nodes, for controlling voltages at said first and second nodes to compensate for fluctuations of said selected first voltage at said output terminal by a fluctuation of said first output circuit;
    first and second current control circuits, each connected to one of said first and second nodes, for controlling currents flowing through said series of resistors to control a difference in potential between said first and second nodes at a first certain value;
    a second voltage divider connected between third and fourth nodes and formed by a series of second resistors;
    at least one second output circuit, connected to said third and fourth nodes and nodes of said second resistors for selecting one of second voltages at said third and fourth nodes and said nodes of said second resistors and generating said selected second voltage at said output terminal;
    third and fourth control voltage circuits, each connected to one of said third and fourth nodes, for controlling voltages at said third and fourth nodes to compensate for fluctuations of said selected second voltage at said output terminal by a fluctuation of said second output circuit; and
    third and fourth current control circuits, each connected to one of said third and fourth nodes, for controlling currents flowing through said series of resistors to control a difference in potential between said third and fourth nodes at a second certain value,
    said first output circuit pulling up a voltage at said output terminal, said second output circuit pulling down the voltage at said output terminal.

14. The circuit as set forth in claim 13, wherein said first output circuit comprises:
    a plurality of first N-channel transistors having gates each connected to one of said first and second nodes and said nodes of said first resistors; and
    a plurality of first switches each connected between one of sources of said first N-channel transistors and said output terminal;
    said second output circuit comprising:

a plurality of first P-channel transistors having gates each connected to one of said third and fourth nodes and said nodes of said second resistors; and a plurality of second switches each connected between one of sources of said first P-channel transistors and said output terminal.

15. The circuit as set forth in claim 14, wherein said first voltage control circuit comprises a second N-channel transistor which is the same type as said first N-channel transistors and has a source connected to a power supply terminal, a gate and a drain both connected to one of said first and second nodes, said second voltage control circuit comprising a second P-channel transistor which is the same type as said second source follower type MOS transistors and has a source connected to a power supply terminal, a gate and a drain both connected to one of said third and fourth nodes.

16. The circuit as set forth in claim 13, wherein said first output circuit comprises:

a plurality of first switches each connected to said first and second nodes and to said nodes of said first resistors; and a first N-channel transistor having a gate connected to said first switches and a source connected to said output terminal, said second output circuit comprising:

a plurality of second switches each connected to said third and fourth nodes and to said nodes of said second resistors; and a first P-channel transistor having a gate connected to said second switches and a source connected to said output terminal.

17. The circuit as set forth in claim 16, wherein said first output circuit further comprises a third switch, connected between the gate of said first N-channel transistor and a power supply terminal, for turning OFF said first N-channel transistor, said second output circuit further comprising a fourth switch, connected between the gate of said first P-channel transistor and a power supply terminal, for turning OFF said first P-channel transistor.

18. The circuit as set forth in claim 16, wherein said first voltage control circuit comprises a second N-channel transistor which is the same type as said first N-channel transistor and has a source connected to a power supply terminal, a gate and a drain both connected to one of said first and second nodes, said second voltage control circuit comprising a second P-channel transistor which is the same type as said first P-channel transistor and has a source connected to a power supply terminal, a gate and a drain both connected to one of said third and fourth nodes.

19. The circuit as set forth in claim 13, further comprising:

at least one additional first voltage control circuit connected to one of said nodes of said first resistors, said additional first voltage control circuit having a similar configuration to said first and second voltage control circuits; and at least one additional second voltage control circuit connected to one of said nodes of said second resistors, said additional second voltage control circuit having a similar configuration to said third and fourth voltage control circuits.

20. The circuit as set forth in claim 13, wherein each of said first, second, third and fourth current control circuits comprises a resistor connected to a power supply terminal.

21. The circuit as set forth in claim 13, wherein each of said first and second current control circuits comprises:

a first current mirror circuit, connected to one of said first and second nodes, for supplying a first current to said one of said first and second nodes; and an additional resistor, connected to said first current mirror circuit, for sensing fluctuations of said series of first resistors to define said first current, each of said third and fourth current control circuits comprising:

a second current mirror circuit, connected to one of said third and fourth nodes, for supplying a second current to said one of said third and fourth nodes; and an additional resistor, connected to said second current mirror circuit, for sensing fluctuations of said series of second resistors to define said second current.

22. The circuit as set forth in claim 13, wherein each of said first and second current control circuits comprises:

a first transistor having a source connected to a first power supply terminal, a gate and a drain connected to the gate of said first transistor;

a second transistor having a source connected to said first power supply terminal, a gate connected to the gate of said first transistor, and a drain connected to one of said first and second nodes; and a first additional resistor, connected between the drain of said first transistor and a second power supply terminal, for sensing fluctuations of said series of first resistors, each of said third and fourth current control circuits comprising:

a third transistor having a source connected to a third power supply terminal, a gate and a drain connected to the gate of said third transistor;

a fourth transistor having a source connected to said third power supply terminal, a gate connected to the gate of said third transistor, and a drain connected to one of said third and fourth nodes; and a second additional resistor, connected between the drain of said third transistor and a fourth power supply terminal, for sensing fluctuations of said series of second resistors.

23. The circuit as set forth in claim 13, wherein each of said first and second current control circuits comprises:

a first transistor having a source connected to a first power supply terminal, a gate connected to a second power supply terminal and a drain;

a second transistor having a source connected to said first power supply terminal, a gate connected to the drain of said first transistor, and a drain connected to one of said first and second nodes; and a first additional resistor, connected between the drain of said first transistor and a third power supply terminal, for sensing fluctuations of said series of first resistor;

each of said third and fourth current control circuits comprising:

a third transistor having a source connected to a fourth power supply terminal, a gate connected to a fifth power supply terminal and a drain;

a fourth transistor having a source connected to said fourth power supply terminal, a gate connected to the drain of said third transistor, and a drain connected to one of said third and fourth nodes; and a second additional resistor, connected between the drain of said third transistor and a sixth power supply terminal, for sensing fluctuations of said series of second resistors.

* * * * *

UNITED STATES PATENT AND TRADEMARK OFFICE
CERTIFICATE OF CORRECTION

PATENT NO. : 5,814,981
DATED : September, 29, 1998
INVENTOR(S) : Hiroshi Tsuchi and Hiroshi Hayama It is certified that error appears in the above-identified patent and that said Letters Patent is hereby corrected as shown below:

Column 4:
Line 16, delete "$V_j - V_{thpi}$" and insert therefor --$V_i - V_{thni}$--

Column 5:
Line 62, delete equation 9 in its entirety and insert therefor $$--V_{n+1} + E_2 = v_2 = \Delta V_{thn} = I_{DS2} \cdot \gamma_2--$$

Column 6:
Line 2, delete equation 10 in its entirety and insert therefor $$--V_i = [RA \cdot (E_2 + v_2 + I_{DS2} \cdot \gamma_2)$$
$$+ RB(E_1 + v_1 + I_{DS1} \cdot \gamma_1)]$$
$$/(RA + RB)$$
$$+ \Delta V_{thn}--$$

Line 10, delete equation 11 in its entirety and insert therefor $$--V_{out} = V_i - (V_{thni} + \Delta V_{thn})$$
$$= [RA \cdot (E_2 + v_2 + I_{DS2} \cdot \gamma_2)$$
$$+ RB(E_1 + v_1 + I_{DS1} \cdot \gamma_1)]$$
$$/ (RA + RB)$$
$$- V_{thni}--$$

UNITED STATES PATENT AND TRADEMARK OFFICE
CERTIFICATE OF CORRECTION

PATENT NO.   : 5,814,981
DATED        : September 29, 1998
INVENTOR(S)  : Hiroshi Tsuchi and Hiroshi Hayama It is certified that error appears in the above-identified patent and that said Letters Patent is hereby corrected as shown below:

Column 8:
Line 4, delete equation 17 in its entirety and insert therefor $$--V_s = (E_1 + v_1 + \Delta V_{thn} + I_{DS1} \cdot \gamma_1)$$
$$- (E_2 + v_2 + \Delta V_{thn} + I_{DS2} \cdot \gamma_2)$$
$$= E_1 - E_2 + (I_{DS1} - I_{DS2}) \cdot \gamma_1--$$

Column 10:
Line 16, delete equation 31 in its entirety and insert therefor $$--I_{DS2} = (E_8 - E_9 + v(404) + \Delta V_{thn})$$
$$/ [(1 + \alpha) \cdot R(406) + \gamma(404)]$$
$$+ I_{so} / (1 + \alpha)--$$

Column 11:
Line 26, delete equation 44 in its entirety and insert therefor $$--I_{DS1} = (E_{16} - E_{13} + v(412) - v(411)) / \gamma(412) - I_{so}$$
$$+ \alpha \cdot [(E_{16} - E_{12} - v(411) - \Delta V_{thp}) / \gamma(412) + I_{so}]$$
$$- \alpha^2 \cdot I_{so}--$$

UNITED STATES PATENT AND TRADEMARK OFFICE
CERTIFICATE OF CORRECTION

PATENT NO.     : 5,814,981
DATED          : September 29, 1998
INVENTOR(S)    : Hiroshi Tsuchi and Hiroshi Hayama It is certified that error appears in the above-identified patent and that said Letters Patent is hereby corrected as shown below:

Column 11 (continued):
Line 56, delete equation 44 in its entirety and insert therefor $$--I_{DS2} = 1/\gamma(415)$$
$$\cdot [E_{14} - E_{15} + v(415) + \Delta V_{thn})$$
$$+ (1 + \alpha) \cdot R(416) / \gamma(414) \cdot (E_{17} - E_{14}$$
$$- v(415) - \Delta V_{thn})] + I_{so}/(1 + \alpha)--$$

Column 12:
Line 3, delete equation 45 in its entirety and insert therefor $$--I_{DS2} = (E_{17} - E_{15} + v(415) - v(414))/\gamma(415) +$$
$$I_{so} + \alpha \cdot [(E_{17} - E_{14} + v(414) - \Delta V_{thn})/\gamma$$
$$(415) + I_{so}] + \alpha^2 \cdot I_{so}--$$

Line 14, delete equation 47 in its entirety and insert therefor $$--I_{DS2} = (E_{17} - E_{15} + v(415) - v(414))/\gamma(415) -$$
$$+ I_{so} - \alpha \cdot \Delta V_{thn} / \gamma(415)$$
$$+ \alpha^2 \cdot I_{so}--$$

UNITED STATES PATENT AND TRADEMARK OFFICE
CERTIFICATE OF CORRECTION

PATENT NO. : 5,814,981
DATED : September 29, 1998
INVENTOR(S) : Hiroshi Tsuchi and Hiroshi Hayama It is certified that error appears in the above-identified patent and that said Letters Patent is hereby corrected as shown below:

Column 14:
Line 60, delete "$I^1_{DS}=I^2_{DS}$ and insert therefor --$I_{DS1} - I_{DS2}$--

Column 18:
Line 22, delete

"for $\Delta Vthn = -0.1$ V, $\Delta Vthp = 0.1$ V and $\alpha = 0.1$,"

And insert therefor

-- for $\Delta Vthn = -0.1$ V, $\Delta Vthp = -0.1$ V and $\alpha = 0.1$,--

Signed and Sealed this

Twenty-fourth Day of July, 2001

*Attest:*

NICHOLAS P. GODICI
*Attesting Officer*     *Acting Director of the United States Patent and Trademark Office*